(12) United States Patent
Azumo et al.

(10) Patent No.: US 12,152,304 B2
(45) Date of Patent: Nov. 26, 2024

(54) FILM FORMING METHOD FOR FORMING SELF-ASSEMBLED MONOLAYER ON SUBSTRATE

(71) Applicant: Tokyo Electron Limited, Tokyo (JP)

(72) Inventors: Shuji Azumo, Nirasaki (JP); Shinichi Ike, Nirasaki (JP); Yumiko Kawano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 746 days.

(21) Appl. No.: 17/028,230

(22) Filed: Sep. 22, 2020

(65) Prior Publication Data

US 2021/0087691 A1 Mar. 25, 2021

(30) Foreign Application Priority Data

Sep. 24, 2019 (JP) .................................. 2019-173469
Jan. 28, 2020 (JP) .................................. 2020-011969

(51) Int. Cl.
*C23C 16/04* (2006.01)
*C23C 16/40* (2006.01)
*C23C 16/56* (2006.01)
*H01L 21/02* (2006.01)

(52) U.S. Cl.
CPC ............ *C23C 16/56* (2013.01); *C23C 16/401* (2013.01); *C23C 16/408* (2013.01); *H01L 21/02244* (2013.01)

(58) Field of Classification Search
None
See application file for complete search history.

(56) References Cited

U.S. PATENT DOCUMENTS

| | | | |
|---|---|---|---|
| 8,741,738 B2* | 6/2014 | Chiu | B81C 1/00269 438/455 |
| 11,164,745 B2* | 11/2021 | Saly | H01L 21/76879 |
| 2017/0256402 A1* | 9/2017 | Kaufman-Osborn | H01L 21/3105 |
| 2018/0076020 A1* | 3/2018 | Wu | H01L 21/02697 |
| 2020/0152430 A1* | 5/2020 | Williams | H01L 21/02126 |

FOREIGN PATENT DOCUMENTS

JP 2007-501902 A 2/2007

OTHER PUBLICATIONS

Hashemi et al. Self-Correcting Process for High Quality Patterning by Atomic Layer Deposition. ACS Nano 2015, 9, 9, 8710-8717.*

* cited by examiner

*Primary Examiner* — David P Turocy
(74) *Attorney, Agent, or Firm* — Nath, Goldberg & Meyer; Jerald L. Meyer; Tanya E. Harkins

(57) ABSTRACT

A film forming method for forming an object film on a substrate including: providing the substrate including an oxide layer of a first material formed on a layer of the first material formed on a surface of a first area, and a layer of a second material formed on a surface of a second area, the second material being different from the first material; reducing the oxide layer; oxidizing a surface of the layer of the first material after reducing the oxide layer; and forming a self-assembled monolayer on the surface of the layer of the first material by supplying a raw material gas of the self-assembled monolayer after oxidizing the surface of the layer of the first material.

7 Claims, 15 Drawing Sheets

FILM FORMING METHOD FOR FORMING SELF-ASSEMBLED MONOLAYER ON SUBSTRATE

CROSS-REFERENCE TO RELATED APPLICATIONS

This application is based upon and claims the benefit of priority from Japanese Patent Application No. 2019-173469, filed on Sep. 24, 2019, and Japanese Patent Application No. 2020-011969, filed on Jan. 28, 2020, the entire contents of which are incorporated herein by reference.

TECHNICAL FIELD

The present disclosure relates to a film forming method.

BACKGROUND

Patent Document 1 discloses a technique of selectively forming a target film in a specific area of a substrate without using a photolithography technique. Specifically, a technique is disclosed in which a self-assembled monolayer (SAM) that inhibits formation of an object film is formed in a partial area of the substrate and the object film is formed in the remaining area of the substrate.

PRIOR ART DOCUMENT

Patent Document

Japanese Laid-Open Patent Publication No. 2007-501902

SUMMARY

According to an embodiment of the present disclosure, there is provided a film forming method of forming an object film on a substrate, the method including: providing the substrate including an oxide layer of a first material formed on a layer of the first material formed on a surface of a first area, and a layer of a second material formed on a surface of a second area, the second material being different from the first material; reducing the oxide layer; oxidizing a surface of the first material after reducing the oxide layer; and forming a self-assembled monolayer on the surface of the layer of the first material by supplying a raw material gas of the self-assembled monolayer after oxidizing the surface of the layer of the first material.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
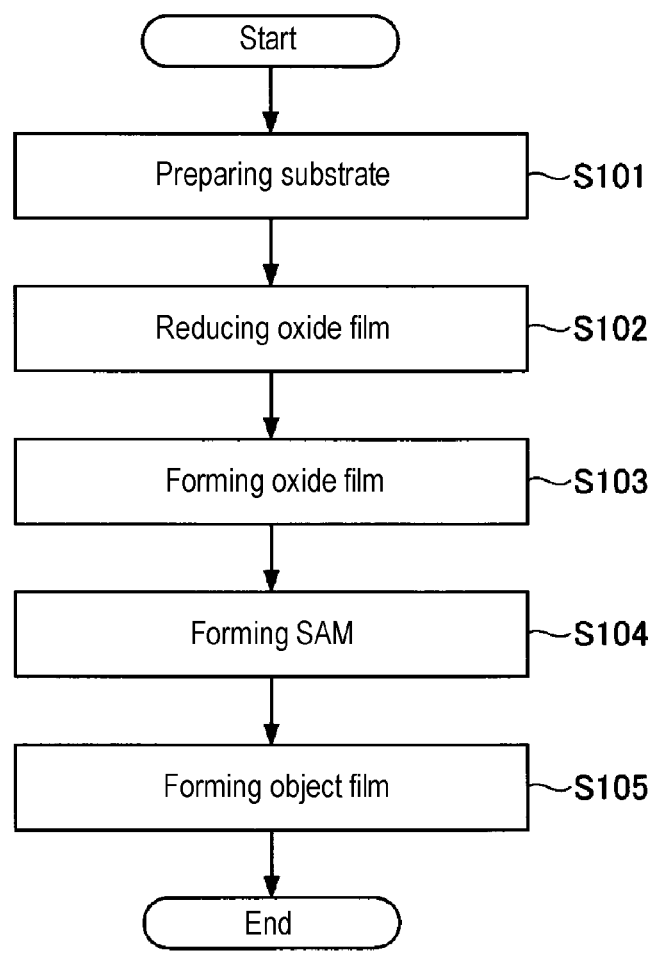
FIG. 1 is a flowchart illustrating an exemplary film forming method according to a first embodiment of the present disclosure.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for executing the present disclosure will be described with reference to the drawings. In the specification and drawings, constituent elements that are substantially the same will be denoted by the same reference numerals, and redundant descriptions may be omitted. The following description will be made using a vertical direction or relationship in the drawings, but it does not represent a universal vertical direction or relationship.

First Embodiment

FIG. 1 is a flowchart illustrating an exemplary film forming method according to a first embodiment of the present disclosure. FIGS. 2A to 2E are cross-sectional views illustrating exemplary states of a substrate in respective steps shown in FIG. 1. FIGS. 2A to 2E illustrate the states of a substrate 10 corresponding to respective steps S101 to S105 illustrated in FIG. 1.

Figure 2A:
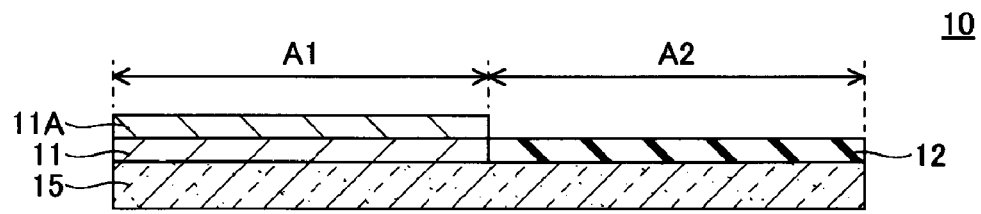
FIGS. 2A to 2E are cross-sectional views illustrating exemplary states of a substrate in respective steps illustrated in FIG. 1.

The film forming method includes step S101 of providing a substrate 10, as illustrated in FIG. 2A. Providing the substrate 10 includes, for example, loading the substrate 10 into a process container (chamber) of a film forming apparatus. The substrate 10 includes a conductive film 11, a natural oxide film 11A, an insulating film 12, and a base substrate 15.

The conductive film 11 and the insulating film 12 are provided on one surface (an upper surface in FIG. 2A) of the base substrate 15, and the natural oxide film 11A is provided on one surface (the upper surface in FIG. 2A) of the conductive film 11. In FIG. 2A, the natural oxide film 11A and the insulating film 12 are exposed on the surface of the substrate 10.

The substrate 10 has a first area A1 and a second area A2. Here, as an example, the first area A1 and the second area A2 are adjacent to each other in a plan view. The conductive film 11 is provided on the top surface side of the base substrate 15 in the first area A1, and the insulating film 12 is provided on the top surface side of the base substrate 15 in the second area A2. The natural oxide film 11A is provided on a top surface of the conductive film 11 in the first area A1.

The number of first areas A1 is one in FIG. 2A, but may be two or more. For example, two first areas A1 may be arranged such that the second area A2 is interposed therebetween. Similarly, the number of second areas A2 is one in FIG. 2A, but may be two or more. For example, two second areas A2 may be arranged such that the first area A1 is interposed therebetween.

Although only the first area A1 and the second area A2 exist in FIG. 2A, a third area may further exist. The third area is an area in which a layer made of a material different from those of the conductive film 11 in the first area A1 and the insulating film 12 in the second area A2 is exposed. The third area may be arranged between the first area A1 and the second area A2, or may be arranged outside the first area A1 and the second area A2.

The conductive film 11 is an exemplary layer of the first material. The first material is a metal such as copper (Cu) or ruthenium (Ru). The surfaces of these metals are naturally oxidized in the atmosphere over time. The oxide is the natural oxide film 11A. The natural oxide film 11A is removable through a reduction process.

Here, as an example, an embodiment in which the conductive film 11 is copper (Cu) and the natural oxide film 11A is copper oxide formed by natural oxidation will be described. The copper oxide as the natural oxide film 11A may include CuO and $Cu_2O$.

The insulating film 12 is an exemplary layer of the second material. The second material is, for example, an insulating material containing silicon (Si), and may be an insulating film made of a so-called low-k material having a low dielectric constant. The insulating film 12 is, for example, silicon oxide, silicon nitride, silicon oxynitride, silicon carbide, silicon oxycarbide, or silicon oxycarbonitride. Hereinafter, silicon oxide is also referred to as SiO regardless of a composition ratio of oxygen and silicon. Similarly, silicon nitride is also referred to as SiN, silicon oxynitride is also referred to as SiON, silicon carbide is also referred to as SiC, silicon oxycarbide is also referred to as SiOC, and silicon oxycarbonitride is also referred to as SiOCN. The second material is SiO in the present embodiment.

The base substrate 15 is a semiconductor substrate such as a silicon wafer. The substrate 10 may further include, between the base substrate 15 and the conductive film 11, a base film formed of a material different from those of the base substrate 15 and the conductive film 11. Similarly, the substrate 10 may further include, between the base substrate 15 and the insulating film 12, a base film formed of a material different from those of the base substrate 15 and the insulating film 12.

Such a base film may be, for example, a SiN layer or the like. The SiN layer or the like may be, for example, an etch stop layer that stops etching.

Figure 2B:
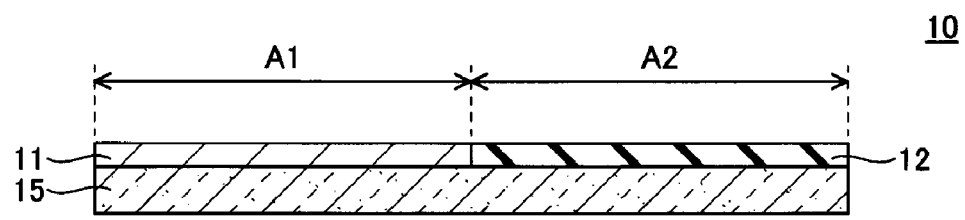

The film forming method includes step S102 of manufacturing the substrate 10 as illustrated in FIG. 2B by reducing the natural oxide film 11A (see FIG. 2A). In order to reduce the natural oxide film 11A, for example, flow rates of hydrogen ($H_2$) and argon (Ar) in the process container of the film forming apparatus are set to 100 sccm and 2500 sccm, respectively, and a pressure in the process container is set to 1 torr to 10 torr (133.32 Pa to 1,333.22 Pa). Then, a susceptor is heated such that a temperature of the substrate 10 is 100 degrees C. to 350 degrees C. under a hydrogen atmosphere in which hydrogen is less than 0.5% of the atmospheric gas within the process container.

In step S102, a copper oxide as the natural oxide film 11A is reduced to Cu and removed. As a result, as illustrated in FIG. 2B, the substrate 10 including the conductive film 11, the insulating film 12, and the base substrate 15 is obtained. Cu serving as the conductive film 11 is exposed on the surface of the first area A1 of the substrate 10. The reduction process of the natural oxide film 11A is not limited to a dry process, but may be a wet process.

Figure 2C:
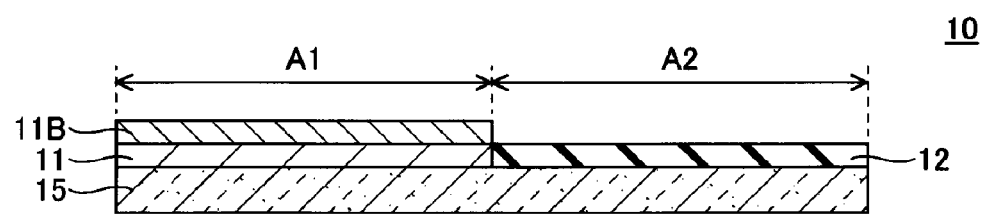

The film forming method includes step S103 of forming a metal oxide film 11B on the surface of the conductive film 11 by oxidizing the surface of the substrate 10, as illustrated in FIG. 2C. In order to form the metal oxide film 11B, for example, flow rates of oxygen ($O_2$) serving as an oxidant and argon (Ar) are set to 500 sccm and 3,000 sccm, respectively, and the pressure in the process container of the film forming apparatus is set to 1 torr to 10 torr (133.32 Pa to 1,333.22 Pa), and the susceptor is heated in an oxygen atmosphere such that the temperature of the substrate 10 becomes 100 degrees C. to 200 degrees C. The oxidant is not limited to oxygen ($O_2$), and each gas of $H_2O$, $O_3$, and $H_2O_2$ may be used.

By step S103, as illustrated in FIG. 2C, a metal oxide film 11B is formed on the surface of the conductive film 11, and a substrate 10 including the conductive film 11, the metal oxide film 11B, the insulating film 12, and the base substrate 15 is obtained. In FIG. 2C, the metal oxide film 11B and the insulating film 12 are exposed on the surface of the substrate 10.

The metal oxide film 11B is a copper oxide film formed on the surface of the Cu film serving as the conductive film 11. The copper oxide film is formed by oxidizing the surface of the Cu film serving as the conductive film 11. Since this oxidation process is performed in the process container having an oxygen atmosphere in which the flow rate of oxygen is controlled in the state in which the substrate 10 is kept at a constant temperature, it is possible to obtain a copper oxide film which is uniform in a surface state (distribution state of CuO and $Cu_2O$), film thickness, and film quality. The copper oxide film may contain CuO and $Cu_2O$, but even when CuO and $Cu_2O$ are contained, the surface state, film thickness, and film quality of the copper oxide film are considered to be uniform.

When step S103 is performed in the same process container as step S102, the oxidation process can be started quickly after the reduction process. Accordingly, a new natural oxide film is difficult to be formed on the conductive film 11, and thus the oxidation process can be started while the surface of the conductive film 11 is in a better condition. When step S103 is performed in a process container different from that used for step S102, the heating temperature in step S103 may be further lowered, and the temperature of the substrate 10 may be 50 degrees C. to 150 degrees C.

Figure 2D:
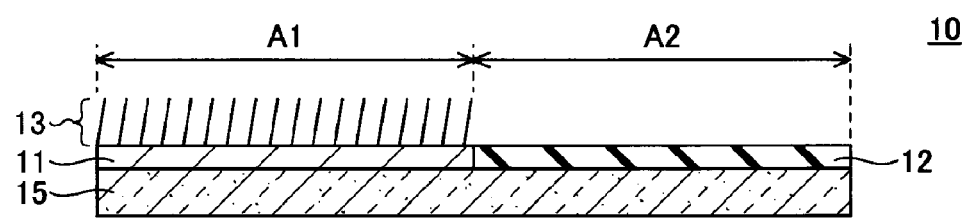

As illustrated in FIG. 2D, the film forming method includes step S104 of forming a self-assembled monolayer (SAM) 13. The SAM 13 is formed in the first area A1 of the substrate 10 and inhibits formation of an object film 14 described later. The SAM 13 is not formed in the second area A2.

An organic compound for forming the SAM 13 may have any of fluorocarbon-based functional group ($CF_x$) or alkyl-based functional group ($CH_x$) as long as it is a thiol-based compound. For example, $CH_3(CH_2)[x]CH_2SH$ [x=1 to 18] and $CF_3(CF_2)[x]CH_2CH_2SH$ [x=0 to 18] may be used. In addition, the fluorocarbon-based functional group ($CF_x$) includes fluorobenzenethiol.

For example, flow rates of the gaseous thiol-based organic compound and argon (Ar) are set to 100 sccm and 1,500 sccm, respectively, and the pressure in the process container of the film forming apparatus is set to 1 torr to 10 torr (133.32 Pa to 1,333.22 Pa). The susceptor is heated such that the substrate 10 has a temperature of 150 degrees C. to 200 degrees C. As an example, step S104 may be performed in the same process container as step S103.

The thiol-based organic compound described above is a compound that easily gives and receives electrons with a metal oxide. Accordingly, the SAM 13 has a property of being adsorbed on the surface of the metal oxide film 11B and not being easily adsorbed on the surface of the insulating film 12 in which electron exchange is unlikely to occur. Further, the copper oxide as the metal oxide film 11B is a metal oxide that is relatively easy to reduce.

Accordingly, when film formation is performed while the thiol-based organic compound is flowing into the process container, the SAM 13 will be selectively formed on the surface of the conductive film 11 while the metal oxide film 11B formed on the surface of the conductive film 11 is being reduced by the thiol-based organic compound. The copper oxide as the metal oxide film 11B is reduced by the thiol-based organic compound to become the surface portion of the conductive film 11, and the SAM 13 is selectively formed on the surface of the conductive film 11.

Accordingly, by step S104, the metal oxide film 11B is reduced and at the same time, the SAM 13 is formed on the surface of the conductive film 11. Thus, as illustrated in FIG. 2D, a substrate 10 having the conductive film 11 and the SAM 13 formed in the first area A1 and the insulating film 12 formed in the second area A2 is obtained. In FIG. 2D, the SAM 13 and the insulating film 12 are exposed on the surface of the substrate 10. In step S104, selectivity and reducing property of the thiol-based organic compound for forming the SAM 13 is used.

Figure 2E:
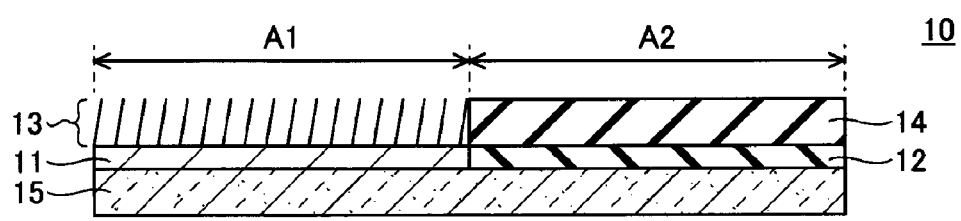

As illustrated in FIG. 2E, the film forming method includes step S105 of selectively forming an object film 14 in the second area A2 using the SAM 13. The object film 14 is formed of a material, such as a metal, a metal compound, or a semiconductor, different from that of the SAM 13. Since the SAM 13 inhibits formation of the object film 14, the object film 14 is selectively formed in the second area A2. When a third area exists in addition to the first area A1 and the second area A2, the object film 14 may or may not be formed in the third area.

The object film 14 is formed through, for example, a chemical vapor deposition (CVD) method or an atomic layer deposition (ALD) method. The object film 14 is formed of, for example, an insulating material. The object film 14, which is an insulating film, may be selectively stacked on the insulating film 12 which originally exists in the second area A2.

The object film 14 is formed of, for example, an insulating material containing silicon. The insulating material containing silicon is, for example, silicon oxide (SiO), silicon nitride (SiN), silicon oxynitride (SiON), or silicon carbide (SiC). The object film 14 may be formed of, for example, an insulating material containing a metal, and the insulating material containing a metal is, for example, alumina ($Al_2O_3$), hafnia (HfO), or zirconia (ZrO).

As described above, according to present embodiment, the natural oxide film 11A existing on the surface of the conductive film 11 is removed by a reduction process, and then the metal oxide film 11B is formed on the surface of the conductive film 11. Since the metal oxide film 11B is formed by performing an oxidation process in an oxygen atmosphere in which the oxygen distribution is controlled to be uniform in the process container of the film forming apparatus, the surface state and the film quality of the metal oxide film 11B are uniform.

Then, the metal oxide film 11B, which has a uniform surface state and film quality as described above, and the selectivity and reducing property of a thiol-based organic compound for producing the SAM 13 are used to reduce the metal oxide film 11B and to form the SAM 13 on the surface of the conductive film 11. Accordingly, the uniform SAM 13 can be selectively formed in the first area A1.

Accordingly, it is possible to provide a film forming method capable of selectively forming a uniform SAM 13 in a desired area.

The thiol-based SAM is known to reduce copper oxide and to be selectively adsorbed to copper. However, the copper oxide film as the natural oxide film 11A has a nonuniform surface state, film quality, thickness, and the like, depending on differences in a type or a state of chemical mechanical polishing (CMP) performed on the surface of the conductive film 11 and conditions under which the natural oxide film 11A is naturally oxidized. Further, Cu is an atom that easily moves in the process of oxidation and reduction.

If a SAM is formed on the surface of the natural oxide film 11A having a nonuniform surface state, film quality, thickness, and the like as described above, it is difficult to uniformly form the SAM.

Further, forming the SAM after reducing the natural oxide film 11A, which is a natural oxide film, may also be considered. In a case where it is attempted to form the SAM 13 by directly supplying the raw material gas (thiol-based organic compound) of the SAM 13 to the surface of the copper film as the conductive film 11 on which copper oxide (CuO and/or $Cu_2O$) is not formed, it is necessary to release hydrogen from the raw material gas of the SAM 13. Thus, a reaction rate becomes slower than that in a case in which the copper oxide (CuO and/or $Cu_2O$) is formed on the surface.

On the other hand, in the present embodiment, a metal oxide film 11B, in which the surface of the Cu film serving as the conductive film 11 is uniformly oxidized, is formed by reducing the copper oxide film as the natural oxide film 11A existing on the surface of the Cu film serving as the conductive film 11. Such a metal oxide film 11B is an oxide film having the surface condition, film quality, thickness, and the like adjusted to be uniform on the conductive film 11. When the surface condition, the film quality, the thickness, and the like are adjusted to be uniform, the SAM 13 is uniformly adsorbed on the metal oxide film 11B, and the reduction process of the metal oxide film 11B by the SAM is uniformly performed. Thus, it is possible to form the SAM 13 which is uniform and highly dense. When forming the SAM 13 on the surface of the conductive film 11 on which the metal oxide film 11B is formed, the copper oxide serving as the metal oxide film 11B is reduced and the raw material gas (thiol-based organic compound) of the SAM 13 is dehydrated. Therefore, the reaction is likely to occur easily, and a relatively high reaction rate can be obtained.

The SAM 13 is difficult to be adsorbed on the surface of the insulating film 12 in which electron exchange is difficult to occur. Therefore, it is possible to selectively form the SAM 13, which is uniform and highly dense, in the first area A1. The first area A1 is an example of a desired area in which a uniform self-assembled monolayer is selectively formed.

In addition, since the uniform SAM 13 can be selectively formed in the first area A1 as described above, the object film 14 can be selectively formed in the second area A2. Therefore, according to the film forming method of the present embodiment, it is possible to improve throughput and to realize a highly productive semiconductor manufacturing process.

In the above description, the embodiment in which the processes of steps S101 to S105 are all performed in the same process container has been described. However, all of the reduction process in step S102, the oxidation process in step S103, the process of forming the SAM 13 in step S104, and the process of forming the object film 14 in step S105 may be performed in different process containers of the film forming apparatus. For example, it is useful when it is desired to independently set processing conditions such as the heating temperature in each step.

In addition, the oxidation process in step S103, the process of forming the SAM 13 in step S104, and the process of forming the object film 14 in step S105 may be performed in the same process container, and the reduction process in step S102 may be performed in a separate process container. For example, it is useful when the reduction process in step S102 is performed by a wet process.

Further, the oxidation process in step S103 and the process of forming the SAM 13 in step S104 may be performed in the same process container, and the reduction processing in step S102 and the process of forming the object film 14 in step S105 may be performed in separate process containers. For example, it is useful when the reduction process in step S102 is performed by a wet process. It is also useful when it is desired to perform step S105 in a process container different from that for forming the SAM 13.

In addition, the reduction process in step S102, the oxidation process in step S103, and the process of forming the SAM 13 in step S104 may be performed in the same process container, and the process of forming the object film 14 in step S105 may be performed in a separate process container. For example, it is useful when it is desired to perform the step S105 in a process container different from that for forming the SAM 13.

In addition, the reduction process in step S102 and the oxidation process in step S103 may be performed in the same process container, and the process of forming the SAM 13 in step S104 and the process of forming the object film 14 in step S105 may be performed in a separate process container. For example, it is useful when it is desired to perform the reduction process of step S102 by a dry process and to perform steps S102 and S103, step S104, and step S105 in separate process containers.

In addition, the providing process in step S101 and the reduction process in step S102 are performed in the same process container.

Second Embodiment

Figure 3:
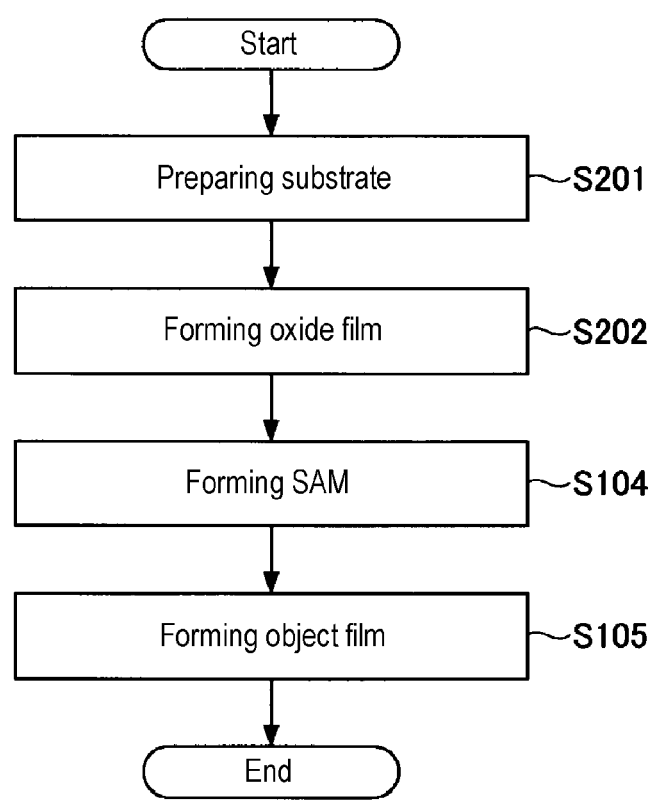
FIG. 3 is a flowchart illustrating an exemplary film forming method according to a second embodiment of the present disclosure.

FIG. 3 is a flowchart illustrating an exemplary film forming method according to a second embodiment of the present disclosure. FIGS. 4A to 4D are cross-sectional views illustrating exemplary states of a substrate in respective steps illustrated in FIG. 3. FIGS. 4A to 4D illustrate the states of a substrate 20 corresponding to steps S201 to S204, respectively, illustrated in FIG. 3.

Figure 4A:
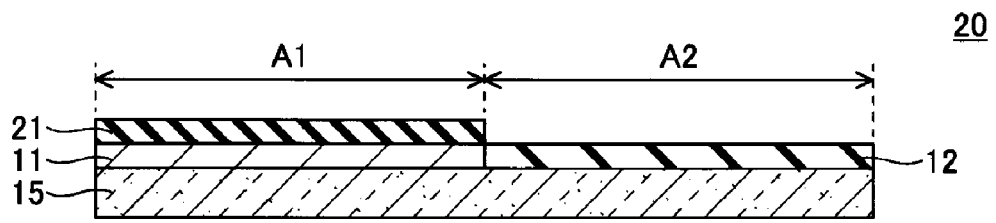
FIGS. 4A to 4D are cross-sectional views illustrating exemplary states of a substrate in respective steps illustrated in FIG. 3.

The film forming method includes step S201 of providing a substrate 20, as illustrated in FIG. 4A. Providing the substrate 20 includes, for example, loading the substrate 20 into a process container of, for example, a film forming apparatus. The substrate 20 includes a conductive film 11, an antirust film 21, an insulating film 12, and a base substrate 25. The substrate 20 has a configuration in which the natural oxide film 11A of the substrate 10 illustrated in FIG. 2A is replaced with the antirust film 21.

The substrate 20 has a first area A1 and a second area A2. The antirust film 21 is provided on one side surface (a top surface in FIG. 4A) of the conductive film 11. That is, in FIG. 4A, the antirust film 21 and the insulating film 12 are exposed on the surface of the substrate 20.

The antirust film 21 is, for example, a film produced by applying an antirust shield that protects the surface of Cu serving as the conductive film 11 from oxidation and sulfidation (by applying an antirust coating), and a specific example of the antirust film 21 is a film made of benzotriazole (BTA). The antirust film 21 is formed on the surface of the conductive film 11.

Figure 4B:
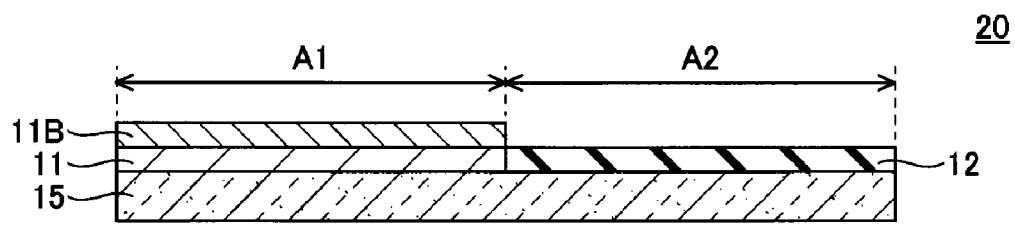

The film forming method includes step S202 of removing the antirust film 21 (see FIG. 4A) by oxidizing the surface of the substrate 20 (see FIG. 4A) while supplying oxygen ($O_2$) gas and argon (Ar) gas, and forming a metal oxide film 11B on the surface of the conductive film 11, as illustrated in FIG. 4B.

In order to form the metal oxide film 11B by removing the antirust film 21, for example, flow rates of oxygen ($O_2$) serving as an oxidant and argon (Ar) are set to 500 sccm and 3,000 sccm, respectively, and the pressure in the process container of the film forming apparatus is set to 1 torr to 10 torr (133.32 Pa to 1,333.22 Pa), and the susceptor is heated in an oxygen atmosphere such that the temperature of the substrate 20 becomes 100 degrees C. to 200 degrees C.

When the substrate 20 is heated to 100 degrees C. to 200 degrees C., the antirust film 21 is decomposed and removed. Accordingly, in step S202, an oxidation process can be performed on the surface of the conductive film 11, and thus the metal oxide film 11B is formed on the surface of the conductive film 11. Accordingly, as illustrated in FIG. 4B, the substrate 20 including the conductive film 11, the metal oxide film 11B, the insulating film 12, and the base substrate 25 is obtained. The configuration of the substrate 20 is the same as the configuration of the substrate 10 illustrated in FIG. 2C.

Figure 4C:
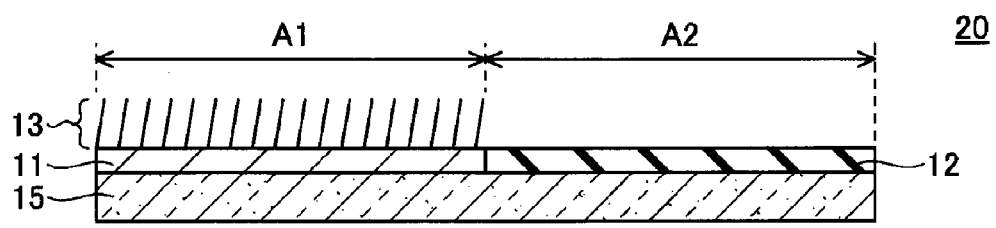
Figure 4D:
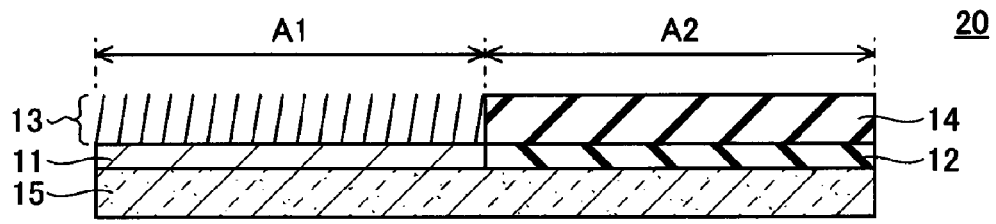

The film forming method includes step S203 of forming a SAM 13 to fabricate the substrate 20, as illustrated in FIG. 4C, and step S204 of selectively forming an object film 14 using the SAM 13 to fabricate the substrate 20, as illustrated in FIG. 4D.

The configurations of the substrates 20 and 20 illustrated in FIGS. 4C and 4D are the same as the configurations of the substrates 10 and 10 illustrated in FIGS. 2D and 2E, respectively, and step S203 and step S204 are the same as step S104 and step S105 illustrated in FIG. 1, respectively.

As described above, according to the present embodiment, in the oxidation process where the metal oxide film 11B is formed, the antirust film 21 existing on the surface of the conductive film 11 is removed, and the metal oxide film 11B is formed on the surface of the conductive film 11. Since the metal oxide film 11B is formed by performing the oxidation process under an oxygen atmosphere in which the oxygen distribution is controlled to be uniform in the process container of the film forming apparatus, the surface condition, film quality, thickness, and the like of the metal oxide film 11B are uniform.

Then, the metal oxide film 11B, which has a uniform surface state, film quality, thickness, and the like as described above, and the selectivity and reducing property of a thiol-based organic compound that produces the SAM 13 are used to reduce the metal oxide film 11B and to form the SAM 13 on the surface of the conductive film 11. Therefore, a uniform SAM 13 can be selectively formed in the first area A1.

Therefore, according to present embodiment, it is possible to provide a film forming method capable of selectively forming a uniform SAM 13 in a desired area.

In the present embodiment, the antirust film 21 on the surface of the Cu film serving as the conductive film 11 is removed through an oxidation process, and a metal oxide film 11B in which the surface of the Cu film (conductive film 11) is uniformly oxidized is formed. Such a metal oxide film 11B is an oxide film having the surface condition, film quality, thickness, and the like adjusted to be uniform on the conductive film 11. When the surface condition, the film quality, the thickness, and the like are adjusted to be uniform, the SAM 13 is uniformly adsorbed on the metal oxide film 11B, and the reduction process of the metal oxide film 11B by the SAM is uniformly performed. Thus, it is possible to form the SAM 13 which is uniform and highly dense. Further, the SAM 13 is difficult to be adsorbed on the surface of the insulating film 12 in which electron exchange is difficult to occur.

Therefore, it is possible to selectively form the SAM 13, which is uniform and highly dense, in the first area A1.

In the above description, it has been described that, in the oxidation process where the metal oxide film 11B is formed, the antirust film 21 existing on the surface of the conductive film 11 is removed and the metal oxide film 11B is formed on the surface of the conductive film 11.

However, the step of removing the antirust film 21 and the step of forming the metal oxide film 11B on the surface of the conductive film 11 may be separately performed. In such a case, in the step of removing the antirust film 21, for example, the antirust film 21 is removed by heating the susceptor such that the substrate 20 has a temperature of about 350 degrees C. in a hydrogen atmosphere of an atmosphere gas containing hydrogen ($H_2$) and argon (Ar). The antirust film 21 is removed through heat treatment using hydrogen. Alternatively, the antirust film 21 may be removed under a hydrogen ($H_2$) plasma atmosphere.

Then, the temperature of the substrate 20 from which the antirust film 21 has been removed may be lowered to a temperature of about 100 degrees C. to 200 degrees C. suitable for the oxidation process as in step S202, and the metal oxide film 11B may be formed on the surface of the conductive film 11. In such a case, the process container may be changed between the step of removing the antirust film 21 and the step of forming the metal oxide film 11B on the surface of the conductive film 11.

Third Embodiment

Figure 5:
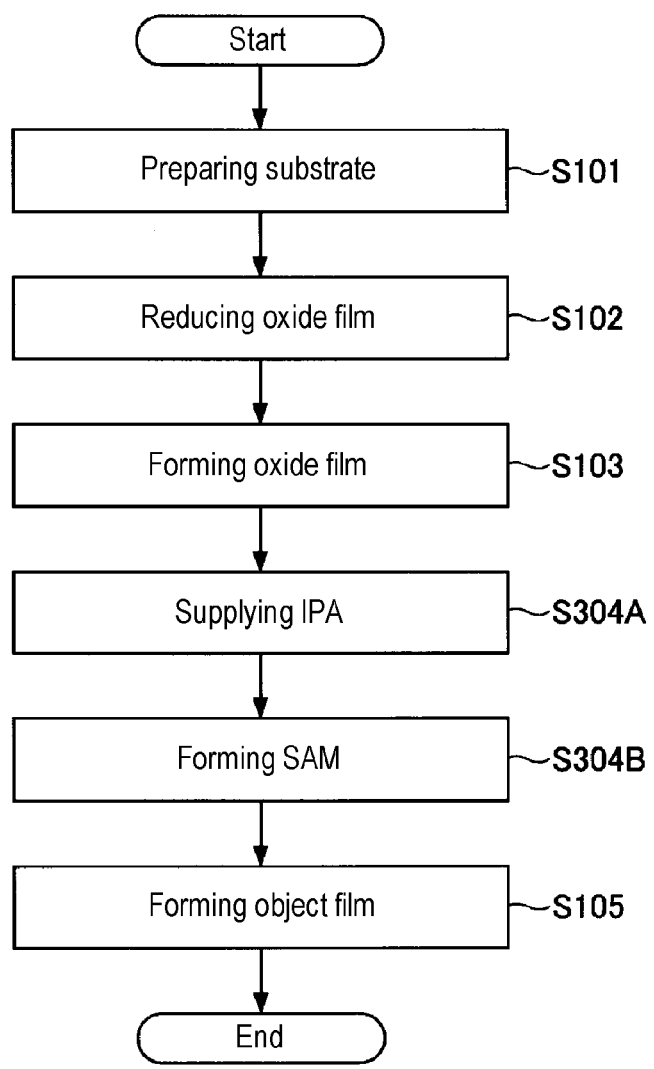
FIG. 5 is a flowchart illustrating an exemplary film forming method according to a third embodiment of the present disclosure.

FIG. 5 is a flowchart illustrating an exemplary film forming method according to a third embodiment. FIGS. 6A to 6F are cross-sectional views illustrating exemplary states of a substrate in respective steps illustrated in FIG. 5. FIGS. 6A to 6F illustrate the states of a substrate 30 corresponding to steps S101 to S103, S304A, S304B, and S105, respectively, illustrated in FIG. 5.

The film forming method of the third embodiment includes steps S304A and S304B instead of step S104 in the film forming method of the first embodiment. Steps S101 to S103 and S105 of the film forming method of the third embodiment are the same as steps S101 to S103 and S105 of the first embodiment. Substrates 30 illustrated in FIGS. 6A to 6C have the same structures as the substrates 10 illustrated in FIGS. 2A to 2C, respectively.

Here, as an example, an embodiment in which the processes of steps S101 to S103, S304A, S304B, and S105 are all performed in the same process container will be described. Differences will be mainly described below.

Figure 6A:
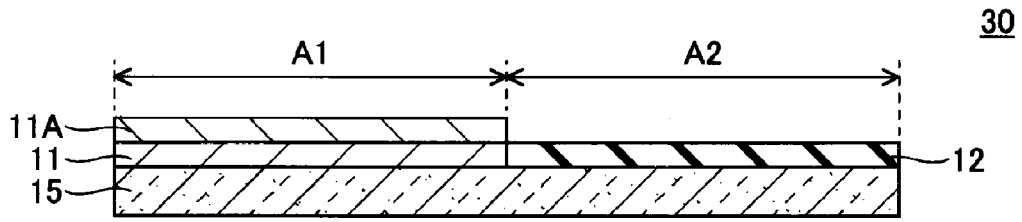
FIGS. 6A to 6F are cross-sectional views illustrating exemplary states of a substrate in respective steps illustrated in FIG. 5.
Figure 6B:
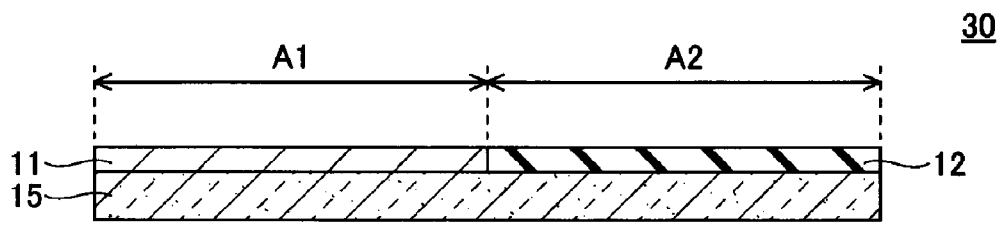
Figure 6C:
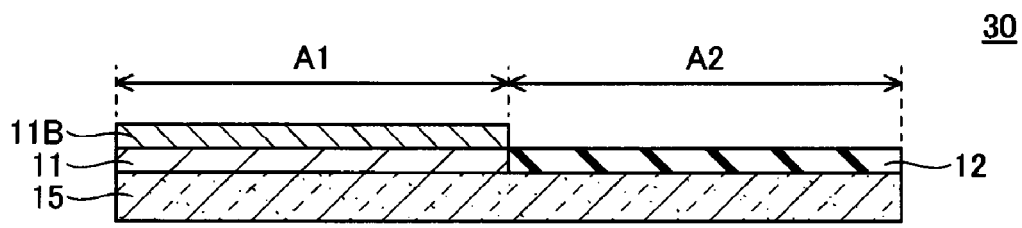

In the film forming method of the third embodiment, as illustrated in FIG. 6C, in step S103, a metal oxide film 11B is formed on the surface of the conductive film 11, and thus a substrate 30 including the conductive film 11, the metal oxide film 11B, the insulating film 12, and the base substrate 15 is obtained. In FIG. 6C, the metal oxide film 11B and the insulating film 12 are exposed on the surface of the substrate 30.

Figure 6D:
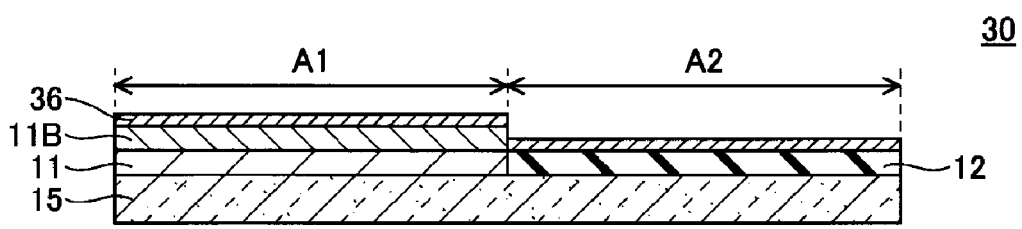

As illustrated in FIG. 6D, the film forming method includes step S304A of supplying vapor or gas of isopropyl alcohol (IPA) into the process container to attach the IPA 36 to the surface of the substrate 30.

When a SAM 13 is formed on the surface of the metal oxide film 11B in the state in which the IPA 36 is attached to the surface of the substrate 30 on which the metal oxide film 11B is exposed in the first area A1, the SAM 13 more uniform than that in the case where the process of supplying the IPA is not performed is obtained. Thus, step S304A is performed.

In the process of supplying the IPA in step S304A, the flow rate of IPA vapor or gas may be set to 50 sccm to 200 sccm, the temperature of the susceptor may be set to 100 degrees C. to 200 degrees C., and the pressure in the process container may be set to 0.1 torr to 10.0 torr (13.33 Pa to 1,333.22 Pa).

Here, FIG. 6D illustrates a state in which the IPA 36 is attached to the surface of the metal oxide film 11B in the first area A1 and the surface of the insulating film 12 in the second area A2. However, the IPA 36 may be attached only to the surface of the metal oxide film 11B in the first area A1.

In addition, here, an embodiment in which the IPA is supplied will be described. In step S304A, vapor or gas of alcohol may be supplied into the process container. Alcohols other than IPA may be, for example, methyl alcohol, ethyl alcohol, n-propyl alcohol, or t-butyl alcohol.

Figure 6E:
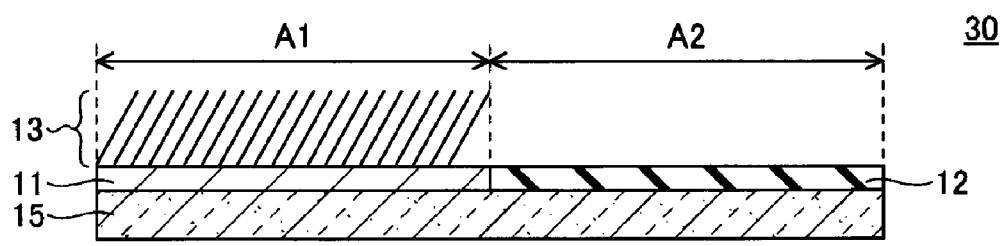

As illustrated in FIG. 6E, the film forming method includes step S304B of forming a SAM 13. The SAM 13 is formed in the first area A1 of the substrate 30 and inhibits formation of an object film 14 described later. The SAM 13 is not formed in the second area A2. Step S304B is the same as step S104 of the first embodiment, except that the SAM 13 is formed in the state in which the IPA 36 is attached to the surface of the substrate 30, as illustrated in FIG. 6D.

By step S304B, the metal oxide film 11B is reduced and at the same time, the SAM 13 is formed on the surface of the conductive film 111. Thus, as illustrated in FIG. 6E, a substrate 30 having the conductive film 11 and the SAM 13 formed in the first area A1 and the insulating film 12 formed in the second area A2 is obtained. In FIG. 6E, the SAM 13 and the insulating film 12 are exposed on the surface of the substrate 30. In step S304B, the selectivity and reducing property of the thiol-based organic compound that forms the SAM 13 is used. In the step of forming the SAM 13, the IPA 36 may disappear, or may remain without disappearing. Either case may be possible.

Figure 6F:
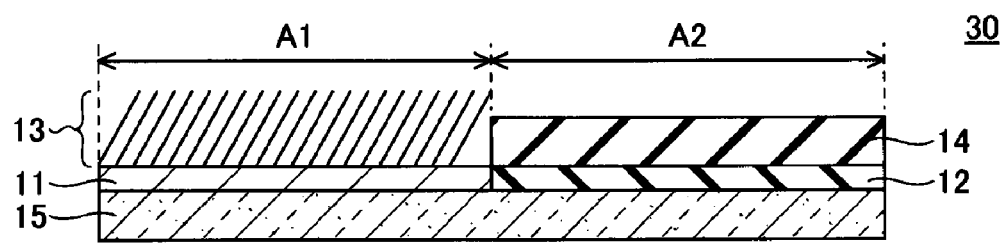

As illustrated in FIG. 6F, the film forming method includes step S105 of selectively forming an object film 14 in the second area A2 by using the SAM 13. Step S105 is the same as step S105 of the first embodiment.

As described above, according to the present embodiment, the natural oxide film 11A existing on the surface of the conductive film 11 is removed by a reduction process, and then the metal oxide film 11B is formed on the surface of the conductive film 11. Since the metal oxide film 11B is formed by performing an oxidation process in an oxygen atmosphere in which the oxygen distribution is controlled to be uniform in the process container of the film forming apparatus, the surface state and the film quality of the metal oxide film 11B are uniform. Then, to the surface of the substrate 30 having the metal oxide 11B formed thereon, as illustrated in FIG. 6C, IPA 36 is attached, as illustrated in FIG. 6D. When the process of supplying the IPA is performed before forming the SAM 13, a more uniform SAM 13 is obtained in the subsequent step S304B.

Then, the metal oxide film 11B, which has a uniform surface state and film quality as described above, and the selectivity and reducing property of a thiol-based organic compound for producing the SAM 13 are used to reduce the metal oxide film 11B and to form the SAM 13 on the surface of the conductive film 11. Accordingly, a uniform SAM 13 can be selectively formed in the first area A1. In the step of forming the SAM 13, the IPA 36 may disappear, or may remain without disappearing. Either case may be possible.

Accordingly, it is possible to provide a film forming method capable of selectively forming a uniform SAM 13 in a desired area.

In the above description, the embodiment in which the processes of steps S101 to S103, S304A, S304B, and S105 are all performed in the same process container has been described. However, all of the reduction process in step S102, the oxidation process in step S103, the process of supplying the IPA in step S304A, the process of forming the SAM 13 in step S304B, and the process of forming the object film 14 in step S105 may be performed in different process containers of the film forming apparatus. For example, it is useful when it is desired to independently set processing conditions such as the heating temperature in each step.

In addition, the oxidation process in step S103, the process of supplying the IPA of step S304A, the process of forming the SAM 13 in step S304B, and the process of forming the object film 14 in step S105 may be performed in the same process container, and the reduction process in step S102 may be performed in a separate process container. For example, this is useful when the reduction process in step S102 is performed by a wet process.

Further, the oxidation process in step S103, the process of supplying the IPA in step S304A, and the process of forming the SAM 13 in step S304B may be performed in the same process container, and the reduction processing in step S102 and the process of forming the object film 14 in step S105 may be performed in separate process containers. For example, it is useful when the reduction process in step S102 is performed by a wet process. It is also useful when it is desired to perform step S105 in a process container different from that for forming the SAM 13.

Further, the reduction process in step S102, the oxidation process in step S103, the process of supplying the IPA in step S304A, and the process of forming the SAM 13 in step S304B may be performed in the same process container, and the process of forming the object film 14 in step S105 may be performed in a separate processing container. For example, it is useful when it is desired to perform the step S105 in a processing container different from that for forming the SAM 13.

In addition, the reduction process in step S102 and the oxidation process in step S103 may be performed in the same process container, and the process of supplying the IPA in step S304A, the process of forming the SAM 13 in step S304B, and the process of forming the object film 14 in step S105 may be performed in separate process containers. For example, it is useful when it is desired to perform the reduction process of step S102 by a dry process and to perform steps S102 and S103, step S304A, step S304B, and step S105 in separate process containers.

In addition, the providing process in step S101 and the reduction process in step S102 are performed in the same process container.

Further, variations regarding the process containers in which the processes of steps S101 to S103, S304A, S304B, and S105 are performed have been described above. However, the process of supplying the IPA in step S304A and the process of forming the SAM 13 in step S304B may be continuously performed in a vacuum state. Continuously performing a plurality of processes in a vacuum state is a so-called in-situ process. The in-situ process includes a case where a plurality of processes are continuously performed in the same process container while maintaining the vacuum state in the same process container, and a case where the process container is moved while maintaining the vacuum state and a plurality of processes are continuously performed.

When step 304B is performed in a state in which the IPA 36 is attached to the surface of the substrate 30, a more uniform SAM 13 is obtained. Therefore, the vacuum state may be maintained from the state in which the IPA 36 is formed on the surface of the substrate 30 in step S304A to form the SAM 13 in step 304B.

Further, the oxidation process in step S103 may be performed by an in-situ process, in addition to the process of supplying the IPA in step S304A and the process of forming the SAM 13 in step S304B. As described above, the process of supplying the IPA in step S304A and the process of forming the SAM 13 in step S304B may be performed in the state in which the surface of the metal oxide film 11B formed on the surface of the conductive film 11 in step S103 is clean.

Further, the reduction process in step S102 may be performed by an in-situ process, in addition to the oxidation process in step S103, the process of supplying the IPA in step S304A, and the process of forming the SAM 13 in step S304B. Since the surface of the conductive film 11 (Cu film) is easily oxidized, it is possible to perform the oxidation process in step S103, the process of supplying the IPA in step S304A, and the process of forming the SAM 13 in step S304B in the state in which the surface of the conductive film 11 is clean by maintaining the vacuum state in the state in which the natural oxide film 11A is reduced.

In the above description, the embodiment in which the natural oxide film 11A of the conductive film 11 is reduced and then the metal oxide film 11B is formed has been described. However, in the first area A1 of the substrate 30, an antirust film 21 (see FIG. 4A) may be formed on the surface of the conductive film 11, as in the second embodiment.

Then, after forming the metal oxide film 11B on the surface of the conductive film 11 after removing the antirust film 21 through heat treatment using hydrogen or removing the antirust film 21 by a plasma process under a hydrogen ($H_2$) plasma atmosphere, the process of supplying the IPA in step S304A may be performed.

Further, as in step S202 of the second embodiment, the IPA may be supplied when the removal of the antirust film 21 and the formation of the metal oxide film 11B on the surface of the conductive film 11 are simultaneously performed.

In the above description, the embodiment in which the process of supplying the IPA in step S304A is performed after the oxidation process in step S103 has been described, but the orders of step S103 and step S304A may be exchanged.

Figure 7A:
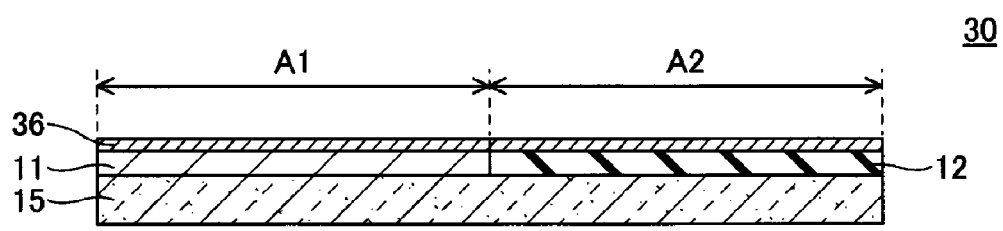
FIGS. 7A and 7B are cross-sectional views illustrating exemplary states of a substrate in a first modification of the third embodiment.
Figure 7B:
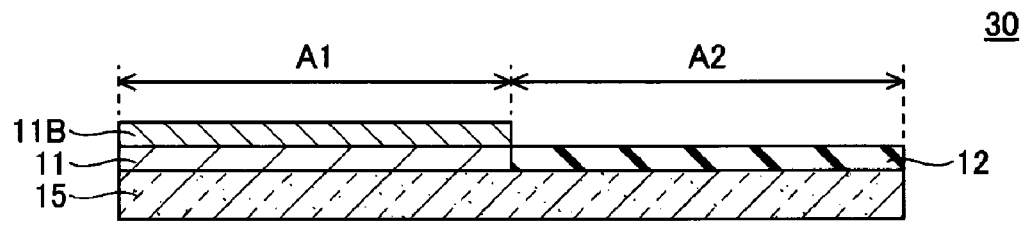

FIGS. 7A and 7B are cross-sectional views illustrating exemplary states of a substrate in a first modification of the third embodiment. As illustrated in FIG. 6B, after the natural oxide film 11A is reduced in step S102, the IPA is supplied into the process container in step S304A to attach the IPA 36 to the surface of the substrate 30 on which the conductive film 11 is exposed in the first area A1, as illustrated in FIG. 7A.

Here, FIG. 7A illustrates the state in which the IPA 36 is attached to the surface of the conductive film 11 in the first area A1 and the surface of the insulating film 12 in the second area A2. However, the IPA 36 may be attached only to the surface of the conductive film 11 in the first area A1.

Then, after step S304A, the oxidation process in step S103 is performed to form a metal oxide film 11B on the surface of the conductive film 11 in the first area A1 as illustrated in FIG. 7B. In this state, the IPA 36 (see FIG. 7A) disappears. After step S103, the process of forming the SAM 13 in step S304B may be performed.

As described above, when the metal oxide film 11B is formed on the surface of the conductive film 11 in the state in which the IPA 36 is attached to the surface of the substrate 30 having the conductive film 11 exposed in the first area A1 and then the SAM 13 is formed, a more uniform SAM 13 is obtained compared with the case where the process of supplying the IPA in step S304A is not performed.

Accordingly, it is possible to provide a film forming method capable of selectively forming a uniform SAM 13 in a desired area.

In the first modification of the third embodiment, the embodiment in which the natural oxide film 11A of the conductive film 11 is reduced and then the metal oxide film 11B is formed has been described. However, in the first area A1 of the substrate 30, an antirust film 21 may be formed on the surface of the conductive film 11, as in the second embodiment.

Then, before forming the metal oxide film 11B on the surface of the conductive film 11 after removing the antirust film 21 through heat treatment using hydrogen or removing the antirust film 21 by a plasma process under a hydrogen (H2) plasma atmosphere, the process of supplying the IPA in step S304A may be performed.

Further, as in step S202 of the second embodiment, IPA may be supplied when the removal of the antirust film 21 and the formation of the metal oxide film 11B on the surface of the conductive film 11 are simultaneously performed.

Figure 8:
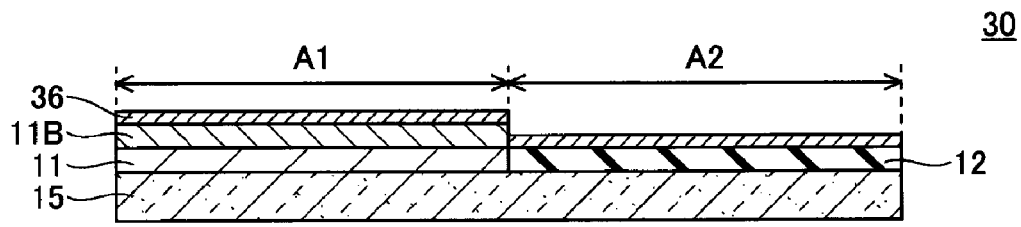
FIG. 8 is a cross-sectional view illustrating exemplary states of a substrate in a second modification of the third embodiment.

Alternatively, step S103 and step S304A may be performed simultaneously. FIG. 8 is a cross-sectional view illustrating exemplary states of a substrate in a second modification of the third embodiment. As illustrated in FIG. 6B, after the natural oxide film 11A is reduced in step S102, step S103 and step S304A are simultaneously performed to oxidize the surface of the conductive film 11 and to supply the IPA into the process container. As a result, as illustrated in FIG. 8, the metal oxide film 11B is formed on the surface of the conductive film 11 in the first area A1, and the IPA 36 is attached to the metal oxide film 11B in the first area A1 and the insulating film 12 in the second area A2.

Here, FIG. 8 illustrates the state in which the IPA 36 is attached to the surface of the metal oxide film 11B in the first area A1 and the surface of the insulating film 12 in the second area A2. However, the IPA 36 may be attached only to the surface of the metal oxide film 11B in the first area A1.

FIG. 8 illustrates the state in which the metal oxide film 11B is formed on the surface of the conductive film 11 in the first area A1 and the IPA 36 is attached to the surface of the metal oxide film 11B. However, the IPA 36 may be attached to the surface of the conductive film 11 in the first area A1 and the metal oxide film 11B may be formed on the IPA 36.

Then, after simultaneously performing step S103 and step S304A, the process of forming the SAM 13 in step S304B may be performed. The IPA 36 disappears in the step of forming the SAM 13.

As described above, when the SAM 13 is formed after simultaneously performing the oxidation process in step S103 and the process of supplying the IPA in step S304A to form the metal oxide film 11B and attaching the IPA 36 to the surface of the substrate 30, a more uniform SAM 13 is obtained compared with the case where the process of supplying the IPA is not performed. Therefore, the uniform SAM 13 can be formed by simultaneously performing the oxidation process in step S103 and the IPA supply process in step S304A.

Therefore, it is possible to provide a film forming method capable of selectively forming a uniform SAM 13 in a desired area.

In the second modification of the third embodiment, the embodiment in which the natural oxide film 11A of the conductive film 11 is reduced and then the metal oxide film 11B is formed has been described. However, in the first area A1 of the substrate 30, an antirust film 21 may be formed on the surface of the conductive film 11, as in the second embodiment.

Then, when a metal oxide film 11B is formed on the surface of the conductive film 11 after removing the antirust film 21 through heat treatment using hydrogen or removing the antirust film 21 by a plasma process under a hydrogen (H2) plasma atmosphere, the process of supplying the IPA may be simultaneously performed.

Further, as in step S202 of the second embodiment, IPA may be supplied when the removal of the antirust film 21 and the formation of the metal oxide film 11B on the surface of the conductive film 11 are simultaneously performed.

Figure 9:
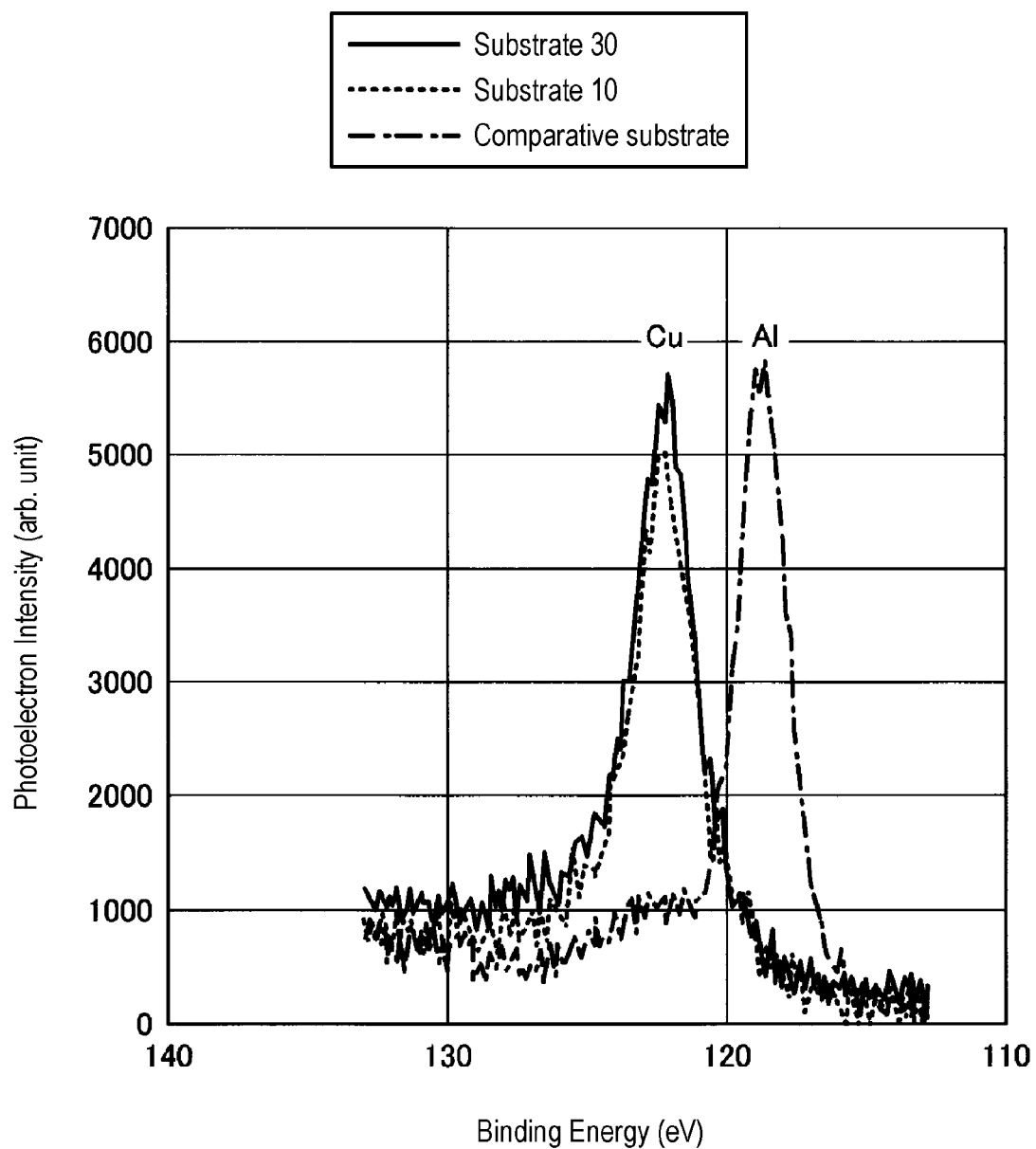
FIG. 9 is a view showing exemplary analysis results of selectivity of a SAM 13.
Figure 10:
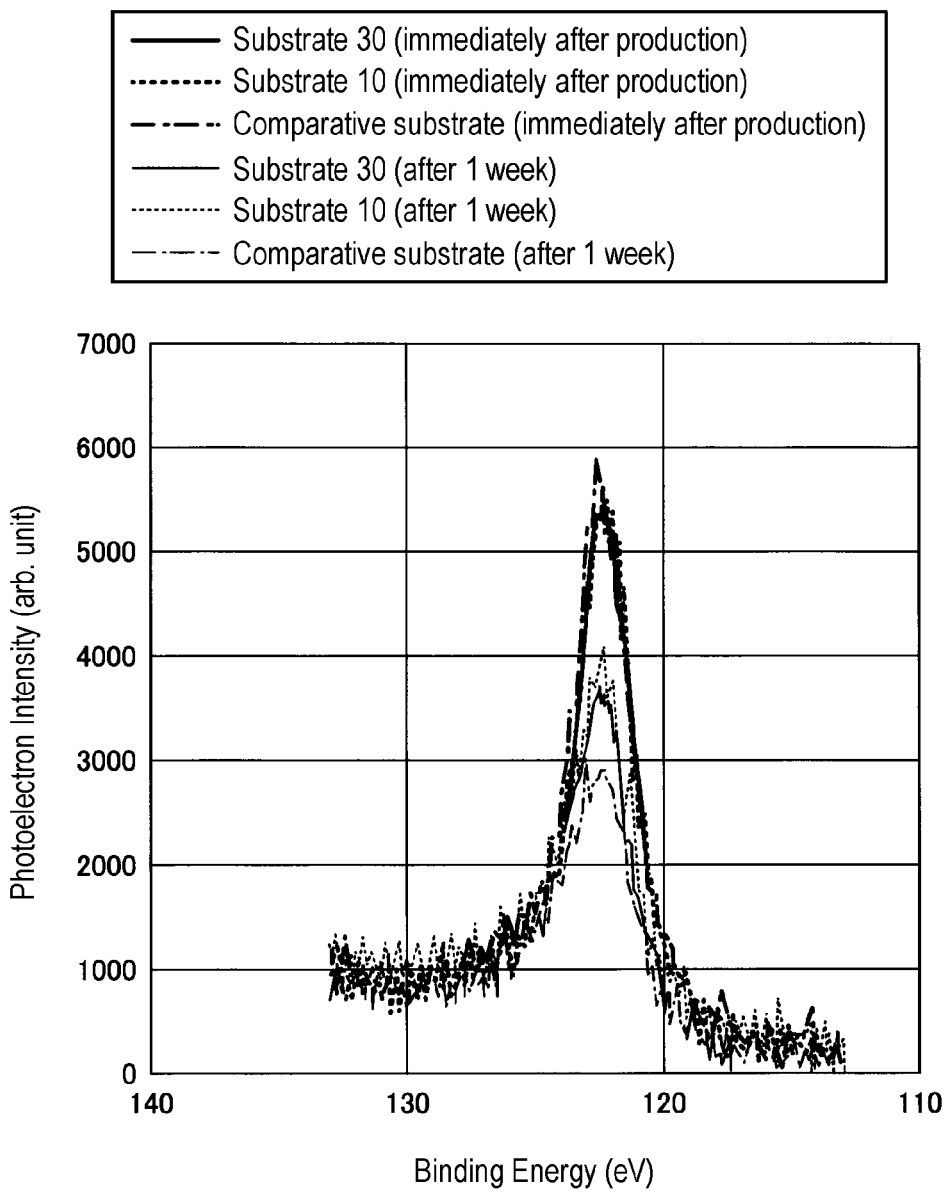
FIG. 10 is a view showing exemplary analysis results of selectivity of the SAM 13.

Next, exemplary analysis results of the selectivity of the SAM 13 will be described with reference to FIGS. 9 and 10. FIGS. 9 and 10 are views showing exemplary analysis results of the selectivity of the SAM 13.

Here, with respect to the substrate 30 of the third embodiment, the substrate 10 of the first embodiment, and a comparative substrate, exemplary results of analysis by an X-ray photoelectron spectroscopy analyzer (XPS) will be described.

In FIG. 9, a horizontal axis represents a binding energy (eV) and a vertical axis represents an intensity of photoelectrons (arb. unit). FIG. 9 shows the analysis results in a binding intensity range of 110 eV to 140 eV. The analysis results in the range of 110 eV to 140 eV shown in FIG. 9 are obtained by setting for viewing Al2s. In FIG. 9, the characteristics of the substrate 30 of the third embodiment are indicated by the solid line, the characteristics of the substrate 10 of the first embodiment (see FIG. 2E) are indicated by a broken line, and the characteristics of the comparative substrate are indicated by a one-dot chain line.

The substrate 30 of the third embodiment is a substrate manufactured by a film forming method including steps S101 to S103, S304A, S304B, and step S105 of the third embodiment. The substrate 10 of the first embodiment (see FIG. 2E) is different from the substrate 30 in that the substrate 10 is manufactured without performing the process of supplying the IPA in step S304A. In addition, the comparative substrate is different from the substrate 30 in that the comparative substrate is manufactured by performing the process of supplying the IPA in step S304A without performing the oxidation process in step S103. The comparative substrate does not include the metal oxide film 11B, and the SAM 13 is directly formed on the conductive film 11.

All the object films on the substrate 30 of the third embodiment, the substrate 10 of the first embodiment, and the target film 14 of the comparative substrate are alumina having a thickness of 6 nm. Alumina (aluminum oxide) may include a compound having a composition ratio of aluminum and oxygen other than $Al_2O_3$.

The three characteristics shown in FIG. 9 represent distributions of the intensity of photoelectron obtained on alumina having a thickness of 6 nm of each of the SAMs 13 and the object films 14 on the substrate 30 of the third embodiment, the substrate 10 of the first embodiment, and the SAM 13 of the comparative substrate.

As shown in FIG. 9, the characteristics of the substrate 30 of the third embodiment (solid line) and the characteristics of the substrate 10 of the first embodiment (broken line) show the results in which peaks exist at about 122 eV, which represents the binding intensity of Cu, and intensity at about 118 eV, which represents the binding intensity of aluminum, is sufficiently low. The characteristics of the comparative substrate (one-dot chain line) show the results in which the intensity at about 122 eV, which represents the binding intensity of Cu, is low and a peak exists at about 118 eV, which represents the binding intensity of aluminum.

The differences among the characteristics of the substrate 30 of the third embodiment (solid line), the characteristics of the substrate 10 of the first embodiment (broken line), and the characteristics of the comparative substrate (one-dot chain line) indicate that the SAM 13 of each of the substrates 30 and 10 can suppress penetration of aluminum included in the object film 14 onto the conductive film 11, and the SAM 13 of the comparative substrate cannot suppress the penetration of aluminum onto the conductive film 11.

From this, it was found that a uniform SAM 13 is obtained by forming the metal oxide film 11B.

FIG. 10 is a view showing exemplary analysis results of the selectivity of the SAM 13. Here, as in FIG. 9, with respect to the substrate 30 of the third embodiment, the substrate 10 of the first embodiment, and the comparative substrate, exemplary results of analysis by an X-ray photoelectron spectroscopy analyzer (XPS) will be described.

Further, FIG. 10 shows analysis results obtained immediately after production and analysis results obtained after exposure to the atmosphere for one week after production of the SAMs 13 of the substrate 30, the substrate 10, and the comparative substrate.

In FIG. 10, a horizontal axis represents a binding energy (eV), and a vertical axis represents an intensity of photoelectron (arb. unit). FIG. 10 shows the analysis results in the case in which a binding intensity was in the range of 110 eV to 140 eV. The analysis results in the range of 110 eV to 140 eV shown in FIG. 10 were obtained by setting for viewing Cu3s.

In FIG. 10, the characteristics of the substrate 30 of the third embodiment immediately after production are indicated by a thick solid line, the characteristics of the substrate 10 of the first embodiment immediately after production (see FIG. 2E) are indicated by a thick broken line, and the characteristics of the comparative substrate immediately after production are indicated by a thick one-dot chain line.

Further, in FIG. 10, the characteristics of the substrate 30 of the third embodiment after exposure to the atmosphere for one week are indicated by a thin solid line, the characteristics of the substrate 10 of the first embodiment after exposure to the atmosphere for one week (see FIG. 2E) are indicated by a thin broken line, and the characteristics of the comparative substrate after exposure to the atmosphere for one week are indicated by a thin one-dot chain line.

The six characteristics shown in FIG. 10 represent distributions of the intensity of photoelectron (signal intensities of Cu3s) obtained from the substrate 30 of the third embodiment, the substrate 10 of the first embodiment, and the SAM 13 of the comparative substrate immediately after production and after exposure to the atmosphere for one week.

Here, the film quality of each SAM 13 one week after the production was evaluated by comparing the peak value of the signal intensity at about 122 eV immediately after the production and the peak value of the signal intensity after exposure to the atmosphere for one week. When the molecules of the SAM 13 are released due to deterioration over time, the density of the SAM 13 is reduced, oxygen in the atmosphere reacts with the conductive film 11 (Cu film) through the gaps in the SAM 13, and copper oxide (CuO and/or $CuO_2$) is generated on the surface of the conductive film 11.

When the copper oxide (CuO and/or $CuO_2$) is generated on the surface of the conductive film 11, the signal intensity of Cu3s decreases. Thus, it is possible to estimate the film quality of the SAM 13 one week after the production.

The signal intensity of the substrate 30 of the third embodiment after exposure to the atmosphere for one week was 77% of the signal intensity of the substrate 30 of the third embodiment immediately after the production.

In addition, the signal intensity of the substrate 10 of the first embodiment after exposure to the atmosphere for one week was 70% of the signal intensity of the substrate 10 of the first embodiment immediately after the production.

Further, the signal intensity of the comparative substrate after exposure to the atmosphere for one week was 56% of the signal intensity of the comparative substrate immediately after the production.

As described above, in the substrate 30 of the third embodiment and the substrate 10 of the first embodiment, the signal intensity of Cu3s was 70% or more even after one week. Thus, values improved by 25% to 37.5% were obtained over the signal intensity of the comparative substrate. From this, it is considered that, as a result of forming the SAM 13 having a strong bond with the conductive film 11, which is a Cu film, by including the metal oxide film 11B, the signal intensity is not significantly reduced even after exposure to the atmosphere for one week.

Further, the signal intensity of Cu3s of the substrate 30 of the third embodiment is 7% higher than that of the substrate 10 of the first embodiment. Thus, a value improved by 10% was obtained. From this, it has been found that, by performing the process of supplying the IPA, a highly uniform SAM 13 that is more strongly bonded to the conductive film 11 is obtained.

Fourth Embodiment

Figure 11:
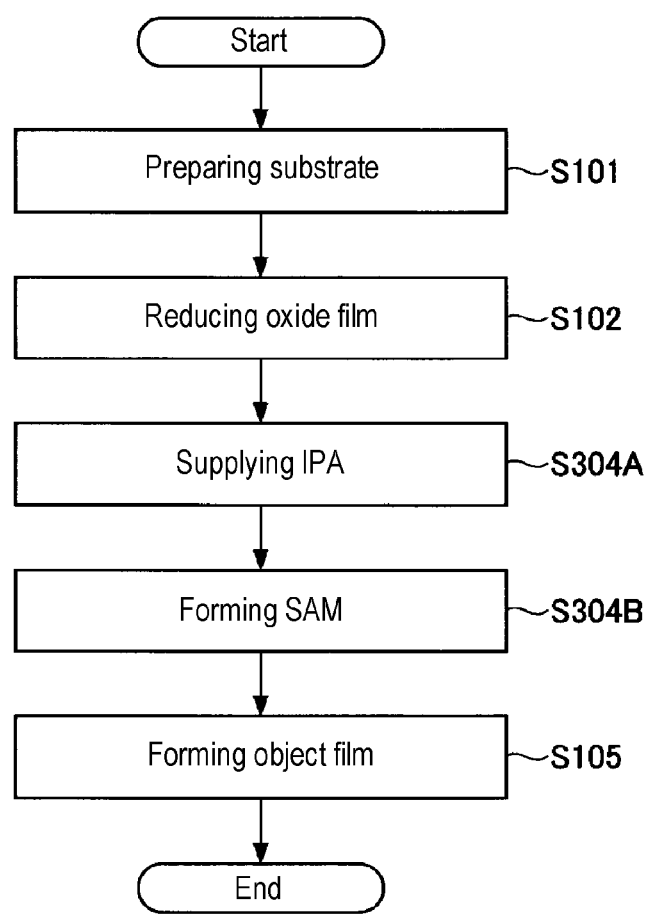
FIG. 11 is a flowchart illustrating an exemplary film forming method according to a fourth embodiment of the present disclosure.

FIG. 11 is a flowchart illustrating an exemplary film forming method according to a fourth embodiment of the present disclosure. FIGS. 12A to 12E are cross-sectional views illustrating exemplary states of a substrate in respective steps illustrated in FIG. 11. FIGS. 12A to 12E illustrate the states of a substrate 40 corresponding to respective steps S101, S102, S304A, S304B, and S105 illustrated in FIG. 11.

The film forming method of the fourth embodiment is the same as the film forming method of the third embodiment, except that the oxidation process in S103 is omitted. Steps S101, S102, S304A, S304B, and S105 of the film forming method of the fourth embodiment are the same as steps S101, S102, S304A, S304B, and S105 of the third embodiment.

Here, as an example, an embodiment in which the processes of steps S101 to S102, S304A, S304B, and S105 are all performed in the same process container will be described. Differences will be mainly described below.

Figure 12A:
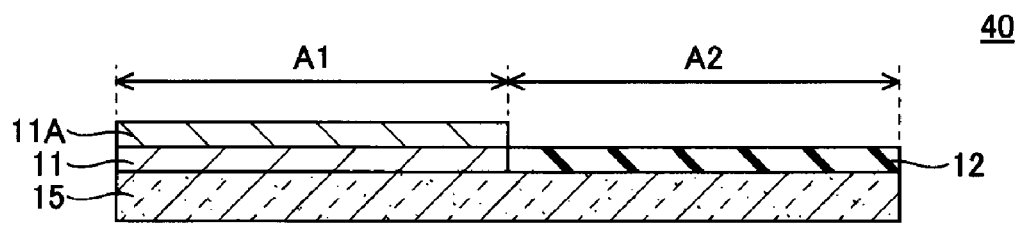
FIGS. 12A to 12E are cross-sectional views illustrating exemplary states of a substrate in respective steps illustrated in FIG. 11.
Figure 12B:
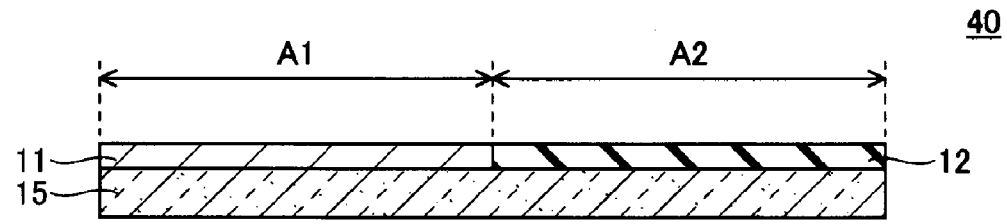

In the film forming method of the fourth embodiment, as illustrated in FIG. 12B, in step S102, copper oxide as a natural oxide film 11A is reduced into Cu and removed, and thus a substrate 40 including the conductive film 11, the insulating film 12, and the base substrate 15 is obtained.

Figure 12C:
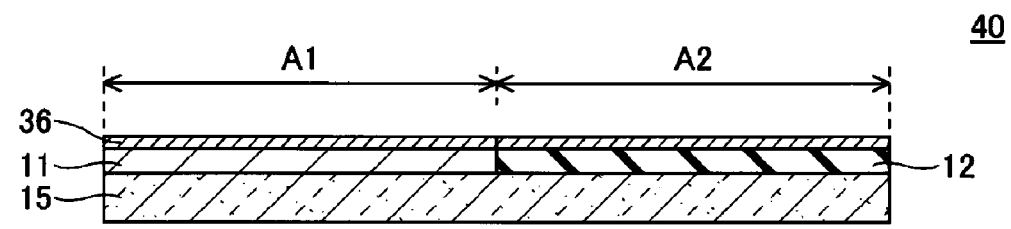

As illustrated in FIG. 12C, the film forming method includes step S304A of supplying vapor or gas of isopropyl alcohol (IPA) into the process container so as to attach the IPA 36 to the surface of the substrate 40.

When a SAM 13 is formed on the surface of the conductive film 11 in the state in which the IPA 36 is attached to the surface of the substrate 40 on which the conductive film 11 is exposed in the first area A1, the SAM 13 more uniform than that in the case where the process of supplying the IPA is not performed is obtained. Thus, step S304A is performed. The details of the process of supplying the IPA in step S304A are the same as those in the third embodiment.

Here, FIG. 12C illustrates the state in which the IPA 36 is attached to the surface of the conductive film 11 in the first area A1 and the surface of the insulating film 12 in the second area A2. However, the IPA 36 may be attached only to the surface of the conductive film 11 in the first area A1.

Figure 12D:
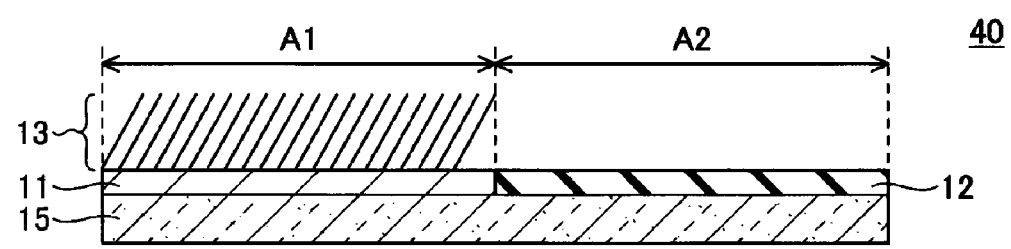

As illustrated in FIG. 12D, the film forming method includes step S304B of forming the SAM 13. The SAM 13 is formed in the first area A1 of the substrate 40 and inhibits formation of an object film 14. The SAM 13 is not formed in the second area A2. Step S304B is the same as step S304B of the third embodiment, except that the SAM 13 is formed in the state in which the IPA 36 is attached to the surface of the conductive film 11 in the first area A1 of the substrate 40, as illustrated in FIG. 12C.

By step S304B, the SAM 13 is formed on the surface of the conductive film 11, and, as illustrated in FIG. 12D, a substrate 40 having the conductive film 11 and the SAM 13 formed in the first area A1 and the insulating film 12 formed in the second area A2 is obtained. In FIG. 12D, the SAM 13 and the insulating film 12 are exposed on the surface of the substrate 40. In the step of forming the SAM 13, the IPA 36 may disappear, or may remain without disappearing. Either case may be possible.

Figure 12E:
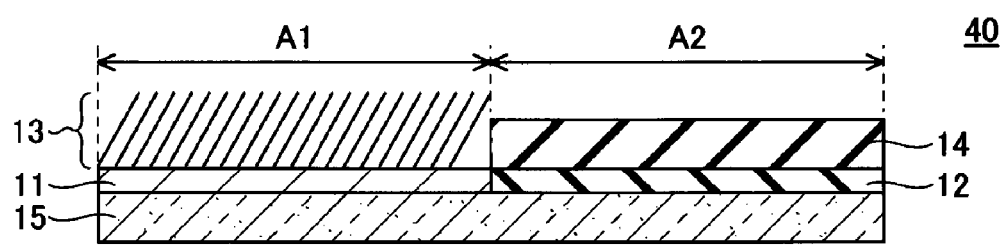

As illustrated in FIG. 12E, the film forming method includes step S105 of selectively forming an object film 14 in the second area A2 by using the SAM 13. Step S105 is the same as step S105 of the first embodiment.

As described above, according to the present embodiment, the natural oxide film 11A existing on the surface of the conductive film 11 is removed through a reduction process, and then the IPA 36 is attached to the surface of the substrate 40, as illustrated in FIG. 12C. When the process of supplying the IPA is performed before forming the SAM 13, a more uniform SAM 13 is obtained in the subsequent step S304B.

Then, the SAM 13 is formed on the surface of the conductive film 11. Accordingly, the uniform SAM 13 can be selectively formed in the first area A1. In addition, the IPA 36 disappears in the step of forming the SAM 13.

Therefore, it is possible to provide a film forming method capable of selectively forming a uniform SAM 13 in a desired area.

In the above description, the embodiment in which the processes of steps S101, S102, S304A, S304B, and S105 are all performed in the same process container has been described. However, all of the reduction process in step S102, the process of supplying the IPA in step S304A, the process of forming the SAM 13 in step S304B, and the process of forming the object film 14 in step S105 may be performed in different process containers of the film forming apparatus. For example, it is useful when it is desired to independently set processing conditions such as the heating temperature in each step.

In addition, the process of supplying the IPA of step S304A, the process of forming the SAM 13 in step S304B, and the process of forming the object film 14 in step S105 may be performed in the same process container, and the reduction process in step S102 may be performed in a separate process container. For example, it is useful when the reduction process in step S102 is performed by a wet process.

Further, the process of supplying the IPA in step S304A and the process of forming the SAM 13 in step S304B may be performed in the same process container, and the reduction process in step S102 and the process of forming the object film 14 in step S105 may be performed in separate process containers. For example, it is useful when the reduction process in step S102 is performed by a wet process. It is also useful when it is desired to perform step S105 in a process container different from that for forming the SAM 13.

Further, the reduction process in step S102, the process of supplying the IPA in step S304A, and the process of forming the SAM 13 in step S304B may be performed in the same process container, and the process of forming the object film 14 in step S105 may be performed in a separate process container. For example, it is useful when it is desired to perform step S105 in a process container different from that for forming the SAM 13.

In addition, the providing process in step S101 and the reduction process in step S102 are performed in the same process container.

Further, variations regarding the process containers in which the processes of steps S101, S102, S304A, S304B, and S105 are performed have been described above. However, the process of supplying the IPA in step S304A and the process of forming the SAM 13 in step S304B may be performed by an in-situ process. When step 304B is performed in the state in which the IPA 36 is attached to the surface of the substrate 40, a more uniform SAM 13 is obtained. Therefore, the vacuum state is maintained from the state in which the IPA 36 is formed on the surface of the substrate 40 in step S304A, and the process of forming the SAM 13 is performed in step 304B.

Further, the reduction process in step S102 may be performed by an in-situ process, in addition to the process of supplying the IPA in step S304A and the process of forming the SAM 13 in step S304B. Since the surface of the conductive film 11 (Cu film) is easily oxidized, it is possible to perform the process of supplying the IPA in step S304A and the process of forming the SAM 13 in step S304B in the state in which the surface of the conductive film 11 is clean by maintaining the vacuum state in the state in which the natural oxide film 11A is reduced.

In the above description, the embodiment in which the natural oxide film 11A of the conductive film 11 is reduced and then the process of supplying the IPA is performed has been described. However, in the first area A1 of the substrate 40, an antirust film 21 may be formed on the surface of the conductive film 11, as in the second embodiment.

Then, after removing the antirust film 21 through heat treatment using hydrogen or removing the antirust film 21 by a plasma process under a hydrogen ($H_2$) plasma atmosphere, the process of supplying the IPA in step S304A may be performed.

Further, as in step S202 of the second embodiment, the IPA may be supplied when the removal of the antirust film 21 and the formation of the metal oxide film 11B on the surface of the conductive film 11 are simultaneously performed.

Film Forming System

Next, a system configured to perform a film forming method according to an embodiment of the present disclosure will be described.

The film forming method according to an embodiment of the present disclosure may be performed in any of a batch apparatus, a single-wafer apparatus, and a semi-batch apparatus. However, the optimum temperature may differ in each of the above steps, or the execution of each step may be hindered when the surface of a substrate is oxidized and thus the surface state is changed. In view of such a point, a multi-chamber type single-wafer film forming system, in which each step can be easily set to an optimum temperature and all steps can be performed in a vacuum, may be used.

Hereinafter, such a multi-chamber type single-wafer film forming system will be described.

Figure 13:
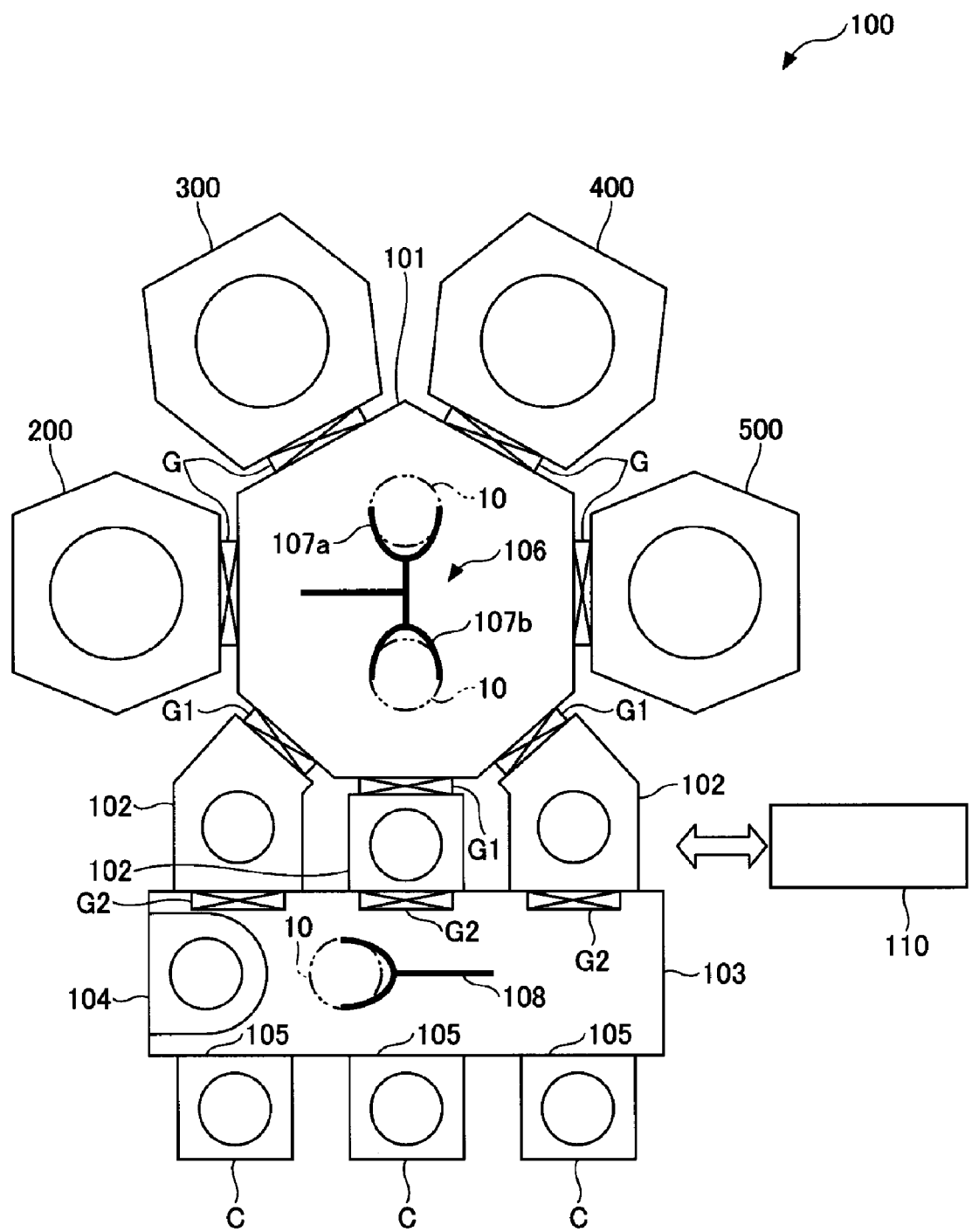
FIG. 13 is a schematic view illustrating an exemplary film forming system configured to perform a film forming method according to an embodiment of the present disclosure.

FIG. 13 is a schematic view illustrating an exemplary film forming system configured to perform a film forming method according to an embodiment of the present disclosure. Here, unless otherwise specified, a case where the substrate 10 is processed will be described.

As illustrated in FIG. 13, the film forming system 100 includes a reduction oxidation process apparatus 200, a SAM forming apparatus 300, an object film forming apparatus 400, and a plasma processing apparatus 500. Such apparatuses are connected to four walls of a vacuum transport chamber 101 having a heptagonal shape in a plan view via gate valves G, respectively. The inside of the vacuum transport chamber 101 is evacuated by a vacuum pump and is maintained at a predetermined degree of vacuum. That is, the film forming system 100 is a multi-chamber type vacuum processing system, and is capable of continuously performing the above-described film forming method without breaking the vacuum.

The oxidation reduction process apparatus 200 performs a reduction process on the substrate 10 (see FIG. 2A), an oxidation process for manufacturing the substrate 10 (see FIG. 2C), and an oxidation process for manufacturing the substrate 20 (see FIG. 4B).

The SAM forming apparatus 300 supplies a gas of a thiol-based organic compound, which forms a SAM 13, to selectively form the SAM 13, thereby forming the SAM 13 of the substrate 10 (see FIG. 2D) and the substrate 20 (see FIG. 4C). Then, the process of supplying the IPA in step S304A in the third embodiment and the fourth embodiment may be performed in the SAM forming apparatus 300.

The object film forming apparatus 400 forms, for example, a silicon oxide (SiO) film as the object film 14 on the substrate 10 (see FIG. 2E) and the substrate 20 (see FIG. 4D) by CVD or ALD.

The plasma processing apparatus 500 performs a process of removing the SAM 13 by etching.

Three load-lock chambers 102 are connected to the other three walls of the vacuum transport chamber 101 via gate valves G1, respectively. An atmospheric transport chamber 103 is provided on the side opposite the vacuum chamber 101, with the load-lock chambers 102 interposed therebetween. The three load-lock chambers 102 are connected to the atmospheric transport chamber 103 via gate valves G2, respectively. The load-lock chambers 102 perform pressure control between atmospheric pressure and vacuum when a substrate 10 is transported between the atmospheric transport chamber 103 and the vacuum transport chamber 101.

The wall of the atmospheric transport chamber 103 opposite to the wall, on which the load-lock chambers 102 are mounted, includes three carrier-mounting ports 105 at each of which a carrier (e.g., a FOUP) C configured to accommodate the substrate 10 is mounted. In addition, on a side wall of the atmospheric transport chamber 103, an alignment chamber 104 is provided to perform alignment of the substrate 10. The atmospheric transport chamber 103 is configured to form a downflow of clean air thereon.

In the vacuum transport chamber 101, a first transport mechanism 106 is provided. The first transport mechanism 106 transports a substrate 10 to the reduction oxidation process apparatus 200, the SAM forming apparatus 300, the object film forming apparatus 400, the plasma processing apparatus 500, and the load-lock chambers 102. The first transport mechanism 106 includes two transport arms 107a and 107b capable of moving independently.

A second transport mechanism 108 is provided in the atmospheric transport chamber 103. The second transport mechanism 108 is configured to transport the substrate 10 to the carriers C, the load-lock chambers 102, and the alignment chamber 104.

The film forming system 100 includes an overall controller 110. The overall controller 110 includes a main controller having a CPU (a computer), an input device (a keyboard, a mouse, and the like), an output device (a printer and the like), a display device (a display and the like), and a storage device (a storage medium). The main controller controls each component of the reduction oxidation process apparatus 200, the SAM forming apparatus 300, the object film forming apparatus 400, the plasma processing apparatus 500, the vacuum transport chamber 101, the load-lock chambers 102, and the like. The main controller of the overall controller 110 causes the film forming system 100 to execute operations that perform the film forming methods of the first to fourth embodiments based on, for example, a processing recipe stored in a storage medium built in a storage device or a storage medium set in the storage device. Each device may be provided with a lower-level controller, and the overall controller 110 may be configured as an upper-level controller.

In the film forming system configured as described above, the second transport mechanism 108 takes out the substrate 10 from the carrier C connected to the atmospheric transport chamber 103 and loads the substrate 10 into one of the load-lock chambers 102 via the alignment chamber 104. Then, after the inside of the load-lock chamber 102 is vacuum evacuated, the first transport mechanism 106 transports the substrate 10 to the reduction oxidation process apparatus 200, the SAM forming apparatus 300, the object film forming apparatus 400, and the plasma processing apparatus 500 to perform the film forming processes of the first to fourth embodiments. Then, as necessary, the plasma processing apparatus 500 removes the SAM 13 by etching.

After the above-described processes are completed, the substrate 10 is transported to one of the load lock chambers 102 by the first transported mechanism 106, and the substrate 10 in the load-lock chamber 102 is returned to the carrier C by the second transport mechanism 108.

The above-described processes are simultaneously performed in parallel on a plurality of substrates 10 to complete selective film forming processes on a predetermined number of substrates 10.

Since each of these processes is performed by an independent single-wafer apparatus, it is easy to set the optimum temperature for each process. Further, since a series of processes can be performed without breaking the vacuum, it is possible to suppress oxidation during the process.

Exemplary Film Forming Process and SAM Forming Apparatus

Next, examples of the oxidation reduction process apparatus 200, the film forming apparatus, such as the object film forming apparatus 400, and the SAM forming apparatus 300 will be described.

Figure 14:
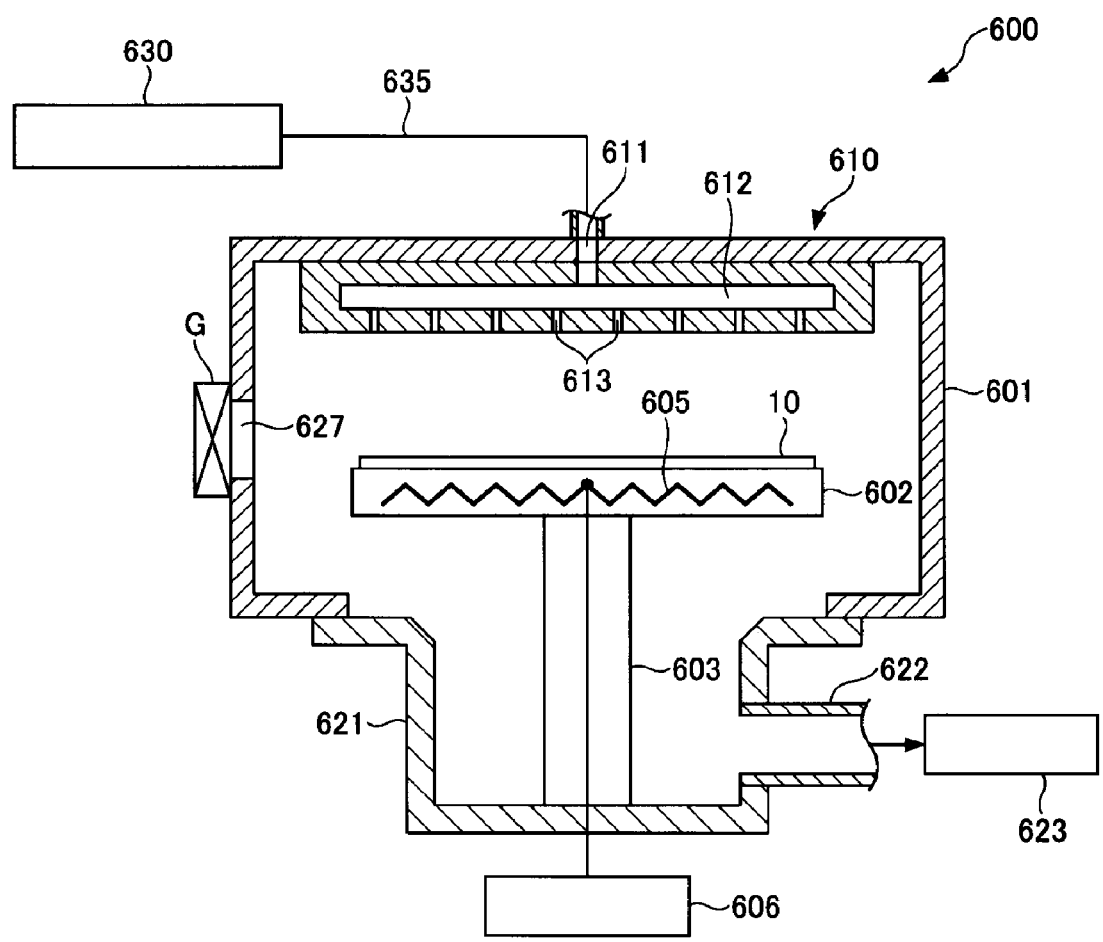
FIG. 14 is a cross-sectional view illustrating an exemplary processing apparatus that can be used as a film forming apparatus and a SAM forming apparatus.

FIG. 14 is a cross-sectional view illustrating an exemplary processing apparatus that can be used as a film forming apparatus and a SAM forming apparatus.

The oxidation reduction process apparatus 200, the film forming apparatus, such as the object film forming device 400, and the SAM forming device 300 may be configured as apparatuses having similar configurations. For example, each of the apparatuses may be configured as a processing apparatus 600 illustrated in FIG. 14.

The processing apparatus 600 includes a substantially cylindrical process container (chamber) 601 that is airtightly configured, and a susceptor 602 configured to horizontally support the substrate 10 is disposed in the process container 601 and supported by a cylindrical support member 603 provided at the center of a bottom wall of the process container 601. A heater 605 is embedded in the susceptor 602 and heats the substrate 10 to a predetermined temperature by being supplied with power from a heater power supply 606. The susceptor 602 is provided with a plurality of wafer-lifting pins (not illustrated) configured to support and move the substrate 10 up or down such that the wafer-lifting pins may protrude or retract with respect to a surface of the susceptor 602.

A shower head 610 configured to introduce a processing gas that forms the film or the SAM into the process container 601 in the form of a shower is provided at a ceiling wall of the process container 601 such that the shower head 610 faces the susceptor 602. The shower head 610 is provided to eject a gas supplied from a gas supply mechanism 630, which will be described below, into the process container 601, and a gas inlet port 611 configured to introduce the gas is formed at an upper portion of the shower head 610. Further, a gas diffusion space 612 is formed inside the shower head 610, and a large number of gas ejection holes 613 communicating with the gas diffusion space 612 are formed in a bottom surface of the shower head 610. Further, the supply of the IPA in step S304A in the third and fourth embodiments may be performed by the shower head 610.

The bottom wall of the process container 601 is provided with an exhaust chamber 621, which protrudes downward. An exhaust pipe 622 is connected to a side surface of the exhaust chamber 621, and an exhaust apparatus 623 including, for example, a vacuum pump and a pressure control valve, is connected to the exhaust pipe 622. Then, by operating the exhaust apparatus 623, the inside of the process container 601 can be brought into a predetermined depressurized (vacuum) state.

A loading/unloading port 627 configured to load/unload the substrate 10 to/from the vacuum transport chamber 101 is provided at the side wall of the process container 601, and the loading/unloading port 627 is opened and closed by the gate valve G.

The gas supply mechanism 630 includes, for example, supply sources of gases that form the object film 14 or the SAM 13, individual pipes configured to supply gas from respective supply sources, an opening/closing valve provided in each of the individual pipes, and a flow rate controller such as a mass flow controller that performs flow rate control of a gas, and further includes a gas supply pipe 635 configured to guide the gas from the individual pipes to the shower head 610 via the gas inlet port 611.

When the processing apparatus 600 performs ALD film formation of silicon oxide (SiO) as the object film 14, the gas supply mechanism 630 supplies a raw material gas of an organic compound and a reaction gas to the shower head 610. In addition, when the processing apparatus 600 forms the SAM, the gas supply mechanism 630 supplies vapor of a compound that forms the SAM into the process container 601. Further, the gas supply mechanism 630 is configured to be capable of supplying an inert gas such as $N_2$ gas or Ar gas as a purge gas or a heat transfer gas. Further, the gas supply mechanism 630 may supply the IPA in step S304A in the third and fourth embodiments.

In the processing apparatus 600 configured as described above, the gate valve G is opened, the substrate 10 is loaded into the process container 601 through the loading/unloading port 627, and then the substrate 10 is placed on the susceptor 602. The susceptor 602 is heated to a predetermined temperature by the heater 605, and the wafer is heated when the inert gas is introduced into the process container 601. Then, the inside of the process container 601 is evacuated by the vacuum pump of the exhaust apparatus 623, and a pressure inside the process container 601 is adjusted to a predetermined pressure.

Next, when the processing apparatus 600 performs ALD film formation of silicon oxide (SiO) as the object film 14, the raw material gas of the organic compound and the reaction gas are alternately supplied from the gas supply mechanism 630 to the process container 601, with purging of the inside of the process container 601 interposed between the supply of the raw material gas and the supply of the reaction gas. Further, when the processing apparatus

600 forms the SAM, the gas supply mechanism 630 supplies the vapor of the organic compound that forms the SAM into the process container 601.

Although the embodiments of the film forming method according to the present disclosure have been described above, the present disclosure is not limited to the above-described embodiments. Various changes, modifications, substitutions, additions, deletions, and combinations can be made within the scope of the claims. These also belong to the technical scope of the present disclosure.

According to an embodiment of the present disclosure, it is possible to selectively form a uniform self-assembled monolayer in a desired area.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming an object film on a substrate, the method comprising:
   providing the substrate including an insulating layer and an oxide layer formed on a surface of a metal layer;
   reducing the oxide layer by supplying hydrogen and argon;
   forming a metal oxide layer which is uniform in a surface state, film thickness, and film quality by selectively oxidizing the surface of the metal layer under an oxygen atmosphere consisting of oxygen and argon after the reducing the oxide layer; and
   forming a self-assembled monolayer on the surface of the metal layer through a reaction in which a raw material of the self-assembled monolayer is uniformly adsorbed on the metal oxide layer and the metal oxide layer is uniformly reduced, by supplying a raw material gas of the self-assembled monolayer, after the forming the metal oxide layer,
   wherein the reducing the oxide layer is performed under a hydrogen atmosphere in which the hydrogen is less than 0.5% of an atmospheric gas within a process container, and
   wherein the reducing the oxide layer and the forming the metal oxide layer are performed in the same process container.

2. The film forming method according to claim 1, further comprising:
   supplying alcohols to a surface of the substrate before forming the self-assembled monolayer after oxidizing the surface of the layer of the first material, or before oxidizing the surface of the layer of the first material after reducing the oxide layer.

3. The film forming method according to claim 2, wherein the alcohols is isopropyl alcohol, methyl alcohol, ethyl alcohol, n-propyl alcohol, or t-butyl alcohol.

4. The film forming method according to claim 1, wherein the metal layer includes copper.

5. The film forming method according to claim 1, wherein the insulating layer includes silicon.

6. The film forming method according to claim 1, wherein a material of the self-assembled monolayer is a material of a thiol-based self-assembled monolayer.

7. The film forming method according to claim 1, further comprising forming the object film on a surface of the insulating layer.

* * * * *